US007772853B2

(12) United States Patent
Shimizu

(10) Patent No.: US 7,772,853 B2
(45) Date of Patent: Aug. 10, 2010

(54) SEMICONDUCTOR DEVICE

(75) Inventor: Toshifumi Shimizu, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 261 days.

(21) Appl. No.: 12/128,909

(22) Filed: May 29, 2008

(65) Prior Publication Data
US 2008/0297166 A1 Dec. 4, 2008

(30) Foreign Application Priority Data
May 29, 2007 (JP) ............... 2007-141267

(51) Int. Cl.
G01R 31/04 (2006.01)
G01R 31/02 (2006.01)
(52) U.S. Cl. .................. 324/538; 324/537
(58) Field of Classification Search ........... 324/537, 324/538, 500, 522, 523, 527, 71.5, 765, 76.11, 324/158.1; 702/1, 108, 127, 183, 189, 193
See application file for complete search history.

(56) References Cited
U.S. PATENT DOCUMENTS
6,452,402 B1 * 9/2002 Kerai .................. 324/538

7,271,597 B2 * 9/2007 Takano ................ 324/538
7,332,907 B2 * 2/2008 Kusumoto ............ 324/158.1
7,486,091 B2 * 2/2009 Park et al. ............ 324/763
2006/0244463 A1 * 11/2006 Fujita .................. 324/538

FOREIGN PATENT DOCUMENTS
JP 2007-080134 3/2007

* cited by examiner

Primary Examiner—Hoai-an D Nguyen
(74) Attorney, Agent, or Firm—Young & Thompson

(57) ABSTRACT

Provided is a semiconductor device determining connection status between an output terminal connected to an output buffer and an external device, the semiconductor device including a test voltage generating circuit to generate test voltage for changing voltage of the output terminal, a connection detection determining circuit to compare voltage of the output terminal with reference voltage and to determine connection status of the external device based on the comparing result, and a compensation circuit generating simulation current where leak current generated at the output buffer is reproduced in a simulatory manner and compensating voltage change of the output terminal by the simulation current.

20 Claims, 14 Drawing Sheets

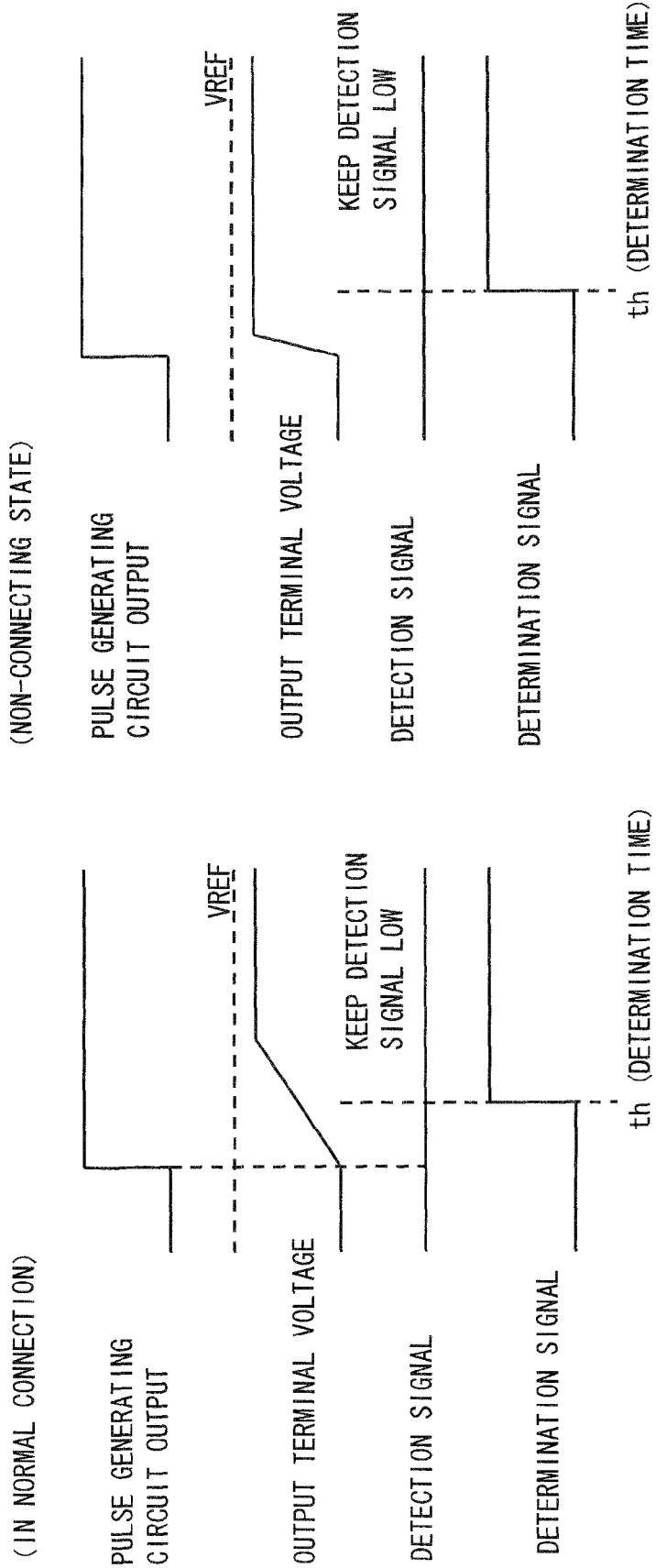

SEMICONDUCTOR DEVICE

BACKGROUND OF THE INVENTION

1. Field of the Invention

The present invention relates to a semiconductor device, and more particularly, to a semiconductor device determining whether the external device is normally connected to the semiconductor device.

2. Description of Related Art

In a communication device performing serial communication with an external device, there is typically provided a connection detecting circuit determining connection status indicating whether the communication device is normally connected to the external device. FIG. 12 shows a related connection detecting circuit. In a related connection detecting circuit 120, pulse voltage is generated by a pulse generating circuit 122 so as to increase voltage of an output terminal OUT. Then a connection detection determining circuit 123 compares the voltage of the output terminal OUT and reference voltage VREF which is set to a central value of an amplitude of pulse voltage, and outputs determination signal indicating whether the external circuit 124 is normally connected to the output terminal OUT of the connection detecting circuit 120 based on the comparing result.

In the related connection detecting circuit 120, whether the external circuit 124 is normally connected to the connection detecting circuit 120 is determined by the following technique. In normal connection (see FIG. 3), the output terminal OUT is in low impedance state. Therefore, when the pulse voltage is output, the voltage of the output terminal OUT slowly increases by time constant determined by resistance R and capacitance C in the external circuit (see output terminal voltage in FIG. 3). On the other hand, in non-connecting state (see FIG. 4), the output terminal OUT is in high impedance state. Therefore, when the pulse voltage is output, the voltage of the output terminal OUT rises substantially at the same time when the pulse voltage rises, and has an amplitude value that is equal to the amplitude value of the pulse voltage (see output terminal voltage in FIG. 4). Therefore, since rising time of the output voltage is different between a case in normal connection and a case in non-connecting state, there is a difference in rising time of the detection signal output based on a result of comparing reference voltage VREF set to the central value of the amplitude of the pulse voltage with the output voltage. Therefore, the detection signal level in the determination time th is different with each other. "H" level determination signal indicating normal connection or "L" level determination signal indicating non-connecting is output to a determination signal output terminal ot. Note that FIGS. 3 and 4 each shows an operation of an ideal connection detecting circuit 120 when leak current input to the output buffer 121 is not considered.

As stated above, in the related connection detecting circuit, the connection status is determined by considering that the rising time of the voltage output to the output terminal OUT is different depending on whether the external circuit is normally connected to the output terminal OUT. Japanese Unexamined Patent Application Publication No. 2007-080134 discloses a serial communication device determining the connection status of the load based on voltage of a signal line connected between the connection detecting circuit and the load.

However, it has now been discovered that the related art causes a problem as follows. In the related connection detecting circuit 120, it can be difficult to normally determine the connection status because the leak current input to the output buffer 121 decreases output voltage of the output terminal OUT. FIG. 13 is a timing chart showing malfunction due to the leak current in normal operation in the related connection detecting circuit 120. As the leak current of the output buffer 121 increases, voltage of the output terminal OUT decreases. Therefore, the voltage of the output terminal OUT is always equal to or smaller than reference voltage VREF. Although the connection detecting circuit causes malfunction in FIG. 13, the "H" level determination signal indicating the normal connection is output since the detection signal output in a period of determination time th is the "L" level signal indicating normal operation. On the other hand, FIG. 14 is a timing chart showing false detection due to the leak current in non-connecting state. As the leak current of the output buffer 121 increases, voltage of the output terminal OUT decreases. Therefore, voltage of the output terminal OUT is always equal to or smaller than reference voltage VREF. Therefore, the "H" level determination signal indicating normal connection is output since the detection signal output in the period of determination time th is the "L" level signal indicating normal operation. As stated above, in the related connection detecting circuit, the connection status may not be normally determined.

SUMMARY

In one embodiment, the present invention provides a semiconductor device determining connection status between an output terminal connected to an output buffer and an external device, the semiconductor device including a test voltage generating circuit to generate test voltage for changing voltage of the output terminal, a connection detection determining circuit to compare voltage of the output terminal with reference voltage and to determine connection status of the external device based on the comparing result, and a compensation circuit to generate simulation current where leak current generated at the output buffer is reproduced in a simulatory manner and compensating voltage change of the output terminal by the simulation current According to the semiconductor device in one aspect of the present invention, it is possible to normally determine connection status by compensating change of the output voltage due to leak current generated at the output buffer by the simulation current generated by the current compensation circuit.

In another embodiment, the present invention provides a semiconductor device determining connection status between an output terminal connected to an output buffer and an external device, the semiconductor device including a test voltage generating circuit to generate test voltage for changing voltage of the output terminal, and a connection detection determining circuit to generate reference voltage compensating voltage change of the output terminal according to leak current generated at the output buffer and determining connection status of the external device based on a result of comparing the reference voltage with voltage of the output terminal.

According to the semiconductor device in one aspect of the present invention, it is possible to normally determine connection status by generating reference voltage compensating voltage change of the output terminal in accordance with leak current generated at the output buffer.

According to the present invention, it is possible to provide a semiconductor device capable of normally determining connection status.

BRIEF DESCRIPTION OF THE DRAWINGS

The above and other objects and advantages and features of the present invention will be more apparent from the following description of certain preferred embodiments taken in conjunction with the accompanying drawings, in which:

FIG. 13 is a timing chart showing malfunction due to leak current in normal operation in the related connection detecting circuit;

FIG. 14 is a timing chart showing false detection due to leak current in non-connecting state in the related connection detecting circuit.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
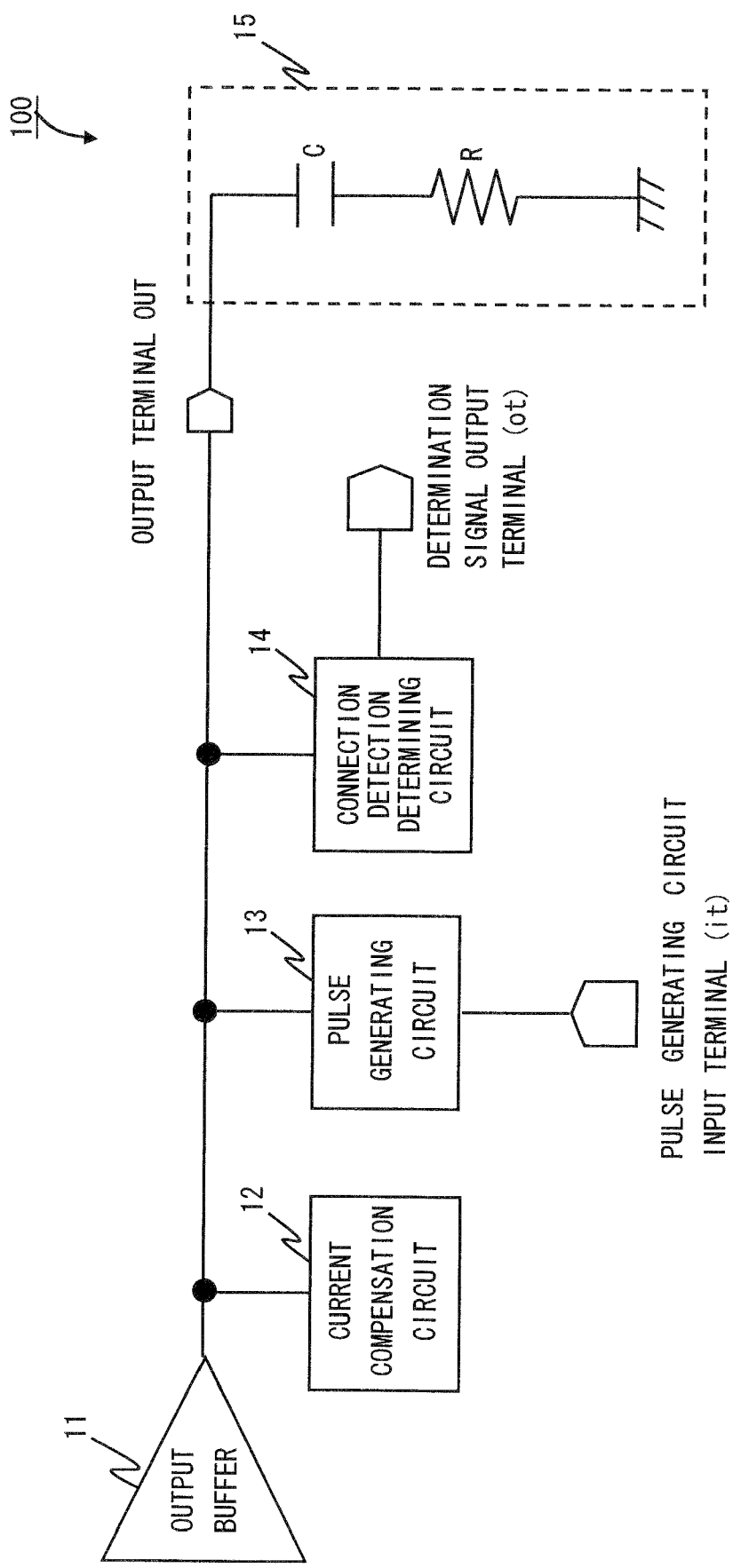
FIG. 1 is a block diagram showing a connection detecting circuit 100 according to a first embodiment.

The embodiment of the present invention will be described hereinafter in detail with reference to the drawings. FIG. 1 is a block diagram showing a semiconductor device (hereinafter referred to as connection detecting circuit) according to the first embodiment of the present invention. As shown in FIG. 1, a connection detecting circuit 100 of the present embodiment includes an output buffer 11, a compensation circuit 12, a test voltage generating circuit 13, a connection detection determining circuit 14, an output terminal OUT, a pulse generating circuit input terminal it, and a determination signal output terminal ot. Further, an external device (hereinafter referred to as external circuit) 15 is connected to the output terminal OUT of the connection detecting circuit 100.

The output buffer 11 is the circuit outputting direct current to the output terminal OUT. The compensation circuit 12 is the circuit generating simulation current where leak current generated at the output buffer is reproduced in a simulatory manner and compensating voltage change of the output terminal OUT according to the simulation current. Hereinafter, the compensation circuit will be called current compensation circuit. The test voltage generating circuit 13 is the circuit generating test voltage for changing the voltage of the output terminal OUT. In the present embodiment, there is employed a pulse generating circuit outputting pulse formed by first level voltage and second level voltage that is larger than the first level voltage as test voltage to the output terminal OUT. Hereinafter, the test voltage generating circuit will be called pulse generating circuit. The connection detection determining circuit 14 is the circuit comparing the voltage of the output terminal OUT with reference voltage and determining the connection status of the external circuit based on the comparing result. The external circuit 15 is the circuit that will be a target for determining whether the external circuit 15 is connected to the connection detecting circuit 100. The detailed configuration of each block will be described with reference to FIG. 2.

The output buffer 11 includes a load circuit 7, NMOS transistors N11 to N13, a positive signal input terminal true, a comparing signal input terminal comp, and a bias terminal bias. A source of the NMOS transistor N11 is connected to ground potential and a drain is connected to sources of the NMOS transistors N12 and N13 that are connected in common. A gate of the NMOS transistor N11 is connected to the bias terminal bias. A drain of the NMOS transistor N12 is connected to the load circuit 7 and a gate is connected to the positive signal input terminal true. A drain of the NMOS transistor N13 is connected to the load circuit 7 and a gate is connected to the comparing signal input terminal comp. The load circuit 7 is connected to power supply potential (hereinafter referred to as power supply voltage VDD). An output terminal OUTc is connected to a node between the load circuit 7 and the NMOS transistor N12 and an output terminal OUTt is connected to a node between the load circuit 7 and the NMOS transistor N13.

The current compensation circuit 12 includes NMOS transistors N14 and N15 corresponding to a first simulation current source and PMOS transistors P11 to P13 corresponding to a first current mirror circuit. The PMOS transistors P11 to P13 form a current mirror circuit. Each source of the PMOS transistors P11, P12, and P13 is connected to each power supply voltage VDD and gates thereof are connected in common. A drain of the PMOS transistor P12 is connected to a node between the output buffer 11 and the output terminal OUTt, and a drain of the PMOS transistor P13 is connected to a node between the output buffer 11 and the output terminal OUTc. A drain of the NMOS transistor N14 is connected to a drain of the PMOS transistor P11 and a source is connected to a drain of the NMOS transistor N15. A gate of the NMOS transistor N14, and a source and a gate of the NMOS transistor N15 are connected to ground potential.

The pulse generating circuit 13 includes a PMOS transistor P14 corresponding to a first switch, resistors R11 to R14, and a current source IS1. One end of the resistors R11 and R12 that are connected in series is connected to power supply voltage VDD and the other end thereof is connected to ground potential through the current source IS1. A source and a drain of the PMOS transistor P14 is connected to each end of the resistor R11. A gate of the PMOS transistor P14 is connected to the pulse generating circuit input terminal it. A node between the resistor R12 and the current source IS1 is connected to a node between the resistors R13 and R14 that are connected in series. One end of the resistor R13 is connected to a node between the output buffer 11 and the output terminal OUTt and one end of the resistor R14 is connected to a node between the output buffer 11 and the output terminal OUTc. Although the test voltage generating circuit is the pulse generating circuit in the present embodiment, the test voltage generating circuit may be any circuit as long as the circuit has voltage where connection between the output terminal and the external device can be checked. Therefore, the test voltage is not limited to pulse.

The connection detection determining circuit 14 includes a first comparator COM1, a second comparator COM2, an operation circuit (hereinafter referred to as NOR circuit) NOR, and a determination circuit 8. A node between the output buffer 11 and the output terminal OUTc is connected to an inverting input terminal of the first comparator COM1 and an output part of the reference voltage source VREF1 is connected to a non-inverting input terminal. An input part of the reference voltage source VREF1 is connected to ground potential. A node between the output buffer 11 and the output terminal OUTt is connected to an inverting input terminal of the second comparator COM2 and an output part of the reference voltage source VREF2 is connected to the non-inverting input terminal. An input part of the reference voltage source VREF2 is connected to ground potential. Output parts of the comparator COM1 and the comparator COM2 are connected to the input part of the NOR circuit NOR and the determination circuit 8 is connected to the output part of the NOR circuit NOR. The output part of the determination circuit 8 is connected to the determination signal output terminal ot.

The external circuit 15 includes resistors R15 and R16, and capacitors C11 and C12. One end of the capacitor C11 is connected to the output terminal OUTc and the other end thereof is connected to one end of the resistor R15. The other end of the resistor R15 is connected to ground potential. One end of the capacitor C12 is connected to the output terminal OUTt and the other end thereof is connected to one end of the resistor R16. The other end of the resistor R16 is connected to ground potential.

Figure 2:
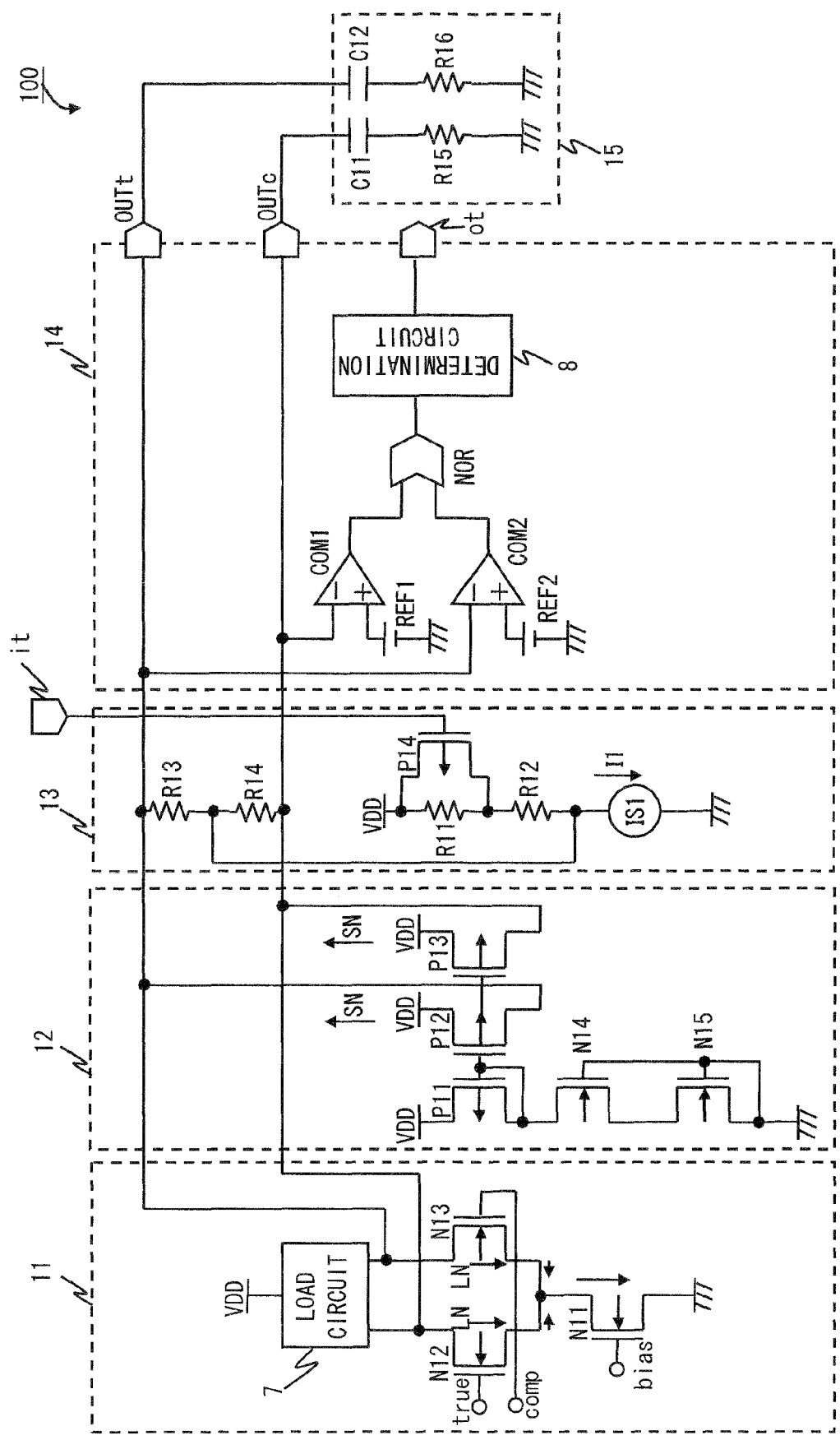
FIG. 2 is a diagram showing the connection detecting circuit 100 according to the first embodiment.
Figure 3:
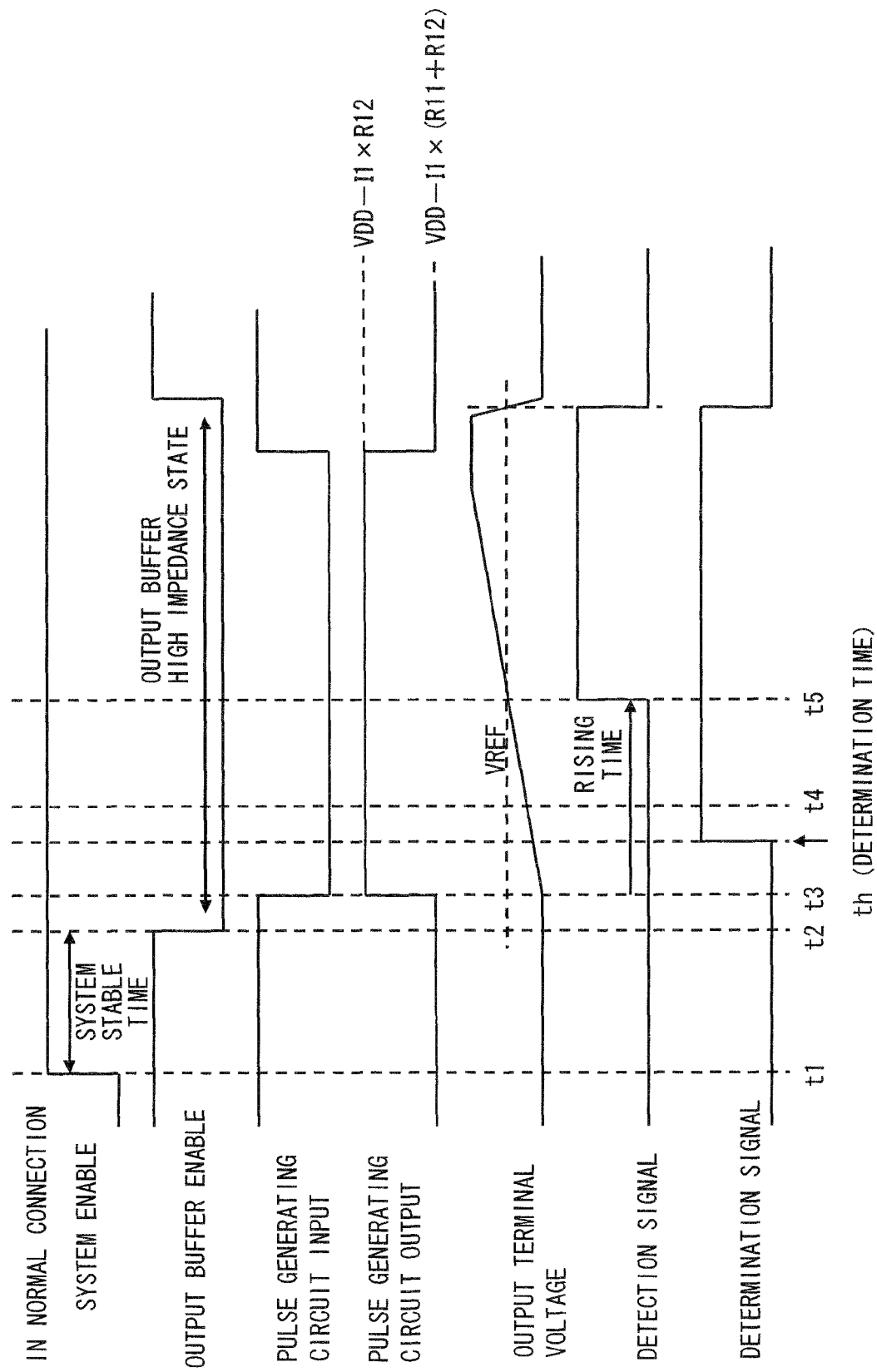
FIG. 3 is a timing chart in normal connection where an external circuit is normally connected to an output terminal in the connection detecting circuit 100 according to the first embodiment.
Figure 4:
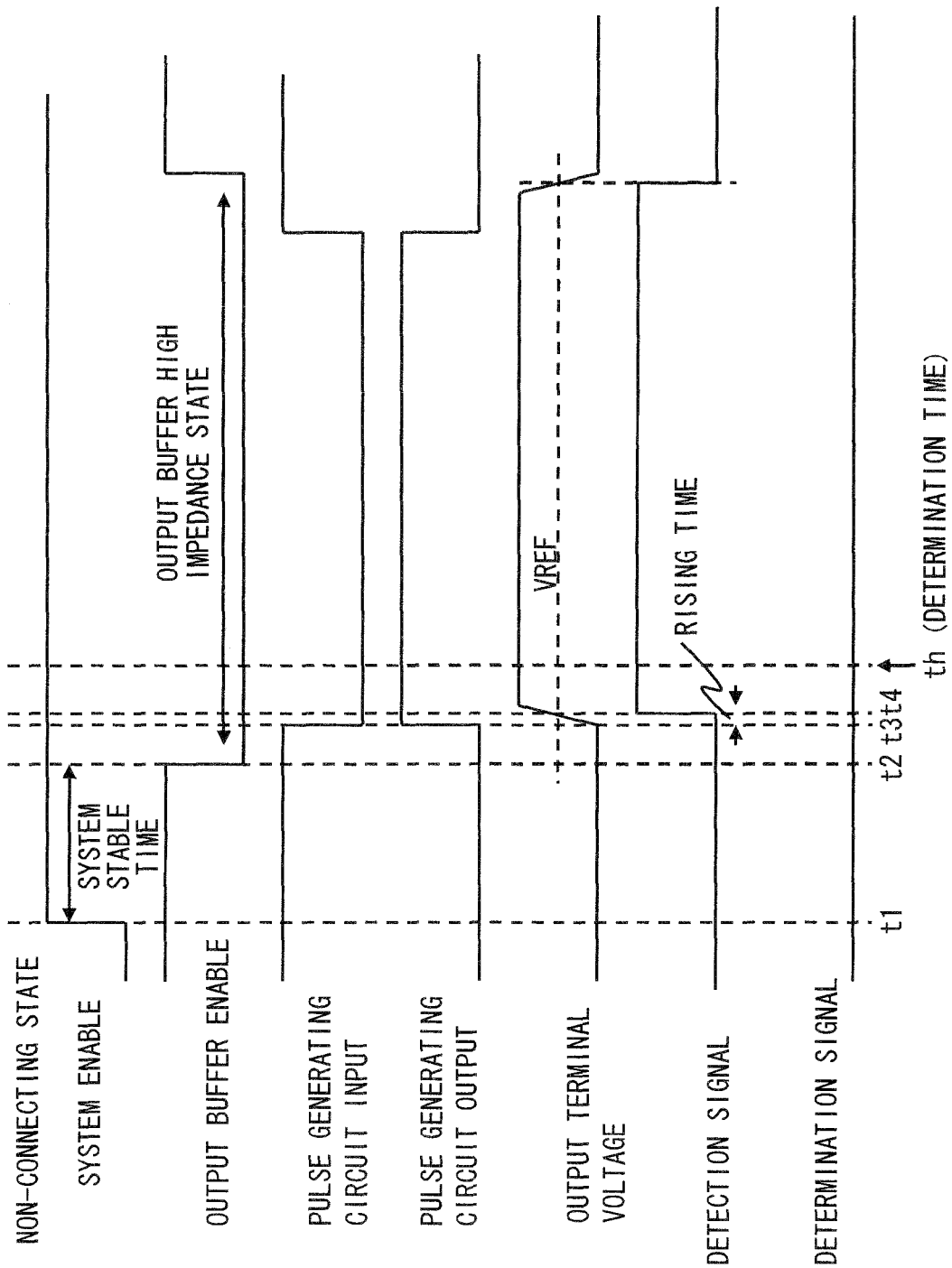
FIG. 4 is a timing chart in non-connecting state where the external circuit is not normally connected to the output terminal in the connection detecting circuit 100 according to the first embodiment.

FIGS. 3 and 4 each shows a wave diagram of each part in the connection detecting circuit 100 shown in FIG. 2. Hereinafter, the operation of the connection detecting circuit 100 of the present embodiment will be described further in detail with reference to the drawings FIGS. 2, 3, and 4. FIG. 3 is a timing chart in normal connection where the external circuit 15 is normally connected to the output terminal OUT. In normal connection, the external circuit 15 is connected to the output terminal OUT through a cable, for example. On the other hand, FIG. 4 shows a timing chart in non-connecting state where the external circuit 15 is not normally connected to the output terminal OUT. In non-connecting state, the cable is not connected, for example.

First, a description will be made on a case where the connection detecting circuit 100 and the external circuit 15 are normally connected. A whole high-speed serial transmission block including the connection detecting circuit block rises (see t1 in FIG. 3) and becomes stable. After that, the load circuit 7 of the output buffer 11 is in high impedance state (see t2 in FIG. 3). In this case, the NMOS transistors N11 to N13 are in off state based on "L" level signals input to each of the bias terminal bias, the positive signal input terminal true, and the comparing signal input terminal comp. In this case, the first leak current flows in the NMOS transistors N11 to N13. Therefore, the voltage output from the output buffer 11 to the output terminal OUT is reduced by an equal amount as the first leak current.

The current compensation circuit 12 generates a first simulation current (hereinafter referred to as simulation current SN) where the first leak current (hereinafter referred to as leak current LN) input to the output buffer 11 is reproduced in the simulatory manner. Since the gate electrode of the NMOS transistor N14 which is the first simulation current source and the gate electrode and the source electrode of the NMOS transistor N15 are connected to ground potential, the NMOS transistors N14 and N15 are in off state. The NMOS transistors N14 and N15 reproduce the NMOS transistors N11 to N13 that are connected between the output terminal OUT and ground potential in the output buffer 11 in the simulatory manner. Therefore, the simulation current SN which is substantially the same voltage as the first leak current LN flows in the NMOS transistors N14 and N15. This simulation current SN flows in the PMOS transistor P11 that is connected to the NMOS transistor N14. Since the PMOS transistors P11 to P13 form the current mirror circuit, the simulation current SN flows in the PMOS transistor P12 and the PMOS transistor P13. Then the simulation current SN is input to the output buffer 11. In other words, the current compensation circuit 12 generates simulation current SN compensating voltage decrease of the output terminal OUT due to the leak current LN input to the output buffer 11 and outputs the simulation current SN to the output buffer.

After the output buffer 11 is in high impedance state, the pulse generating circuit 13 outputs pulse voltage to the output terminal OUT. For example, when "L" level signal is input to the pulse generating circuit input terminal it (see t3 in FIG. 3), the PMOS transistor P14 is in on state. Therefore, if the current I1 flows in the current source IS1, voltage of VDD−I1*R12 is output to the output terminal OUT. On the other hand, when the "H" level signal is input to the pulse generating circuit input terminal it, the PMOS transistor P14 is in off state. Therefore, voltage of VDD−I1*(R11+R12) is output to the output terminal OUT.

When the pulse voltage is output to the output terminal OUT, the voltage of the output terminal OUT is increased. In normal connection, the output terminal OUT is in low impedance state. Therefore, voltage of the output terminal OUT slowly increases based on time constant determined by resistance in the resistors R15 and R16 and capacitance in the capacitors C11 and C12 in the external circuit 15 (see output terminal voltage in FIG. 3).

The connection detection determining circuit 14 first compares the output voltage with reference voltage VREF. Note that reference voltage VREF is set to a central value of the amplitude of the pulse voltage. Now, the central value of the amplitude of the pulse voltage will be described. As stated above, a maximum value of the amplitude of the pulse voltage is VDD−I1*R12. On the other hand, a minimum value of the amplitude of the pulse voltage is VDD−I1*(R11+R12). Therefore, the central value of the amplitude of the pulse voltage, which is reference voltage VREF, can be expressed by (maximum value of amplitude+minimum value of amplitude)/2=VDD−(R11/2+R12)I (see VREF in FIG. 3).

Since the output voltage of the output terminal OUT is smaller than reference voltage VREF for some time after the pulse voltage is output (see t4 in FIG. 3), the first comparator COM1 and the second comparator COM2 output "H" level signals. The NOR circuit NOR outputs "L" level detection signal based on the "H" level signals. After that, when the output voltage is equal to or larger than reference voltage VREF (see t5 in FIG. 3), the first comparator COM1 and the second comparator COM2 output "L" level signals. The NOR circuit NOR outputs "H" level detection signal based on the "L" level signals.

The detection signal in "L" level or "H" level output from the NOR circuit NOR is input to the determination circuit 8. The determination circuit 8 determines the signal level of the detection signal in the preset determination time th. In normal connection, the detection signal output by the NOR circuit NOR in determination time th is in "L" level. When the detection signal is in "L" level, the determination circuit 8 outputs the "H" level determination signal. By doing so, the "H" level determination signal indicating that the external circuit 15 is normally connected to the connection detecting circuit 100 is output.

Next, a description will be made on a case where the connection detecting circuit 100 and the external circuit 15 are not connected. Since the operations of the output buffer 11 and the current compensation circuit 12 are the same as in the case of normal connection, the detailed description thereof will be omitted here.

In non-connecting state, the output buffer 11 and the output terminal OUT are in high impedance state. Therefore, when the pulse voltage is output, the voltage of the output terminal OUT rises substantially at the same time when the pulse voltage rises and has the amplitude value which is the same as the amplitude value of the pulse voltage (see output terminal voltage in FIG. 4).

The connection detection determining circuit 14 compares the output voltage with reference voltage VREF that is set to the center of the amplitude of the pulse voltage. Although the reference voltage is set to the center of the amplitude of the pulse voltage in the present embodiment, the reference voltage can be any as long as the voltage enables determination of connection detection. In non-connecting state, the output terminal OUT rises substantially at the same time when the pulse voltage rises. Therefore, the output voltage becomes equal to or larger than reference voltage VREF as soon as the pulse voltage is output (see t4 in FIG. 4). Therefore, the first comparator COM1 and the second comparator COM2 output "L" level signals. Therefore, the NOR circuit NOR outputs "H" level detection signal as soon as the pulse voltage rises. Therefore, in non-connecting state, the detection signal output from the NOR circuit NOR in the determination time th is in "H" level. When the detection signal is in "H" level, the determination circuit 8 outputs the "L" level determination signal. Therefore, the "L" level determination signal indicating that the external circuit 15 is in non-connecting state is output.

As stated above, in the present embodiment, there is provided a current compensation circuit 12 generating simulation current compensating voltage decrease of the output terminal OUT due to the leak current input to the output buffer 11. This current compensation circuit makes it possible to generate the simulation current which is substantially the same current as the leak current input to the output buffer 11 or output from the output buffer 11 and input the simulation current to the output buffer 11. Therefore, it is possible to compensate the voltage decrease of the output terminal OUT due to the leak current.

Further, in the present embodiment, the first simulation current is generated by the NMOS transistors N14 and N15 that are connected in series. The first simulation current is obtained by reproducing the NMOS transistors N11 to N13 connected between the output terminal OUT and ground potential in the output buffer 11 in the simulatory manner. Therefore, if the NMOS transistor N11 of the output buffer is the resistor, for example, the first simulation current source of the current compensation circuit can also be formed by one NMOS transistor.

In the connection detecting circuit 100, it is determined whether the external circuit is normally connected by compensating the voltage decrease of the output terminal OUT due to the leak current input to the output buffer 11. More specifically, when the external circuit is normally connected, the output destination is in high impedance state, and when the external circuit is not normally connected, the output destination is in low impedance state. When the output destination is in low impedance state, the voltage of the output terminal OUT slowly increases by time constant determined by resistance and capacitance in the resistor and the capacitor in the external circuit. Therefore, the rising time of the voltage of the output terminal OUT is delayed. On the other hand, when the output destination is in high impedance state, the voltage of the output terminal OUT rises substantially at the same time when the pulse voltage rises and has the amplitude value which is the same as the amplitude value of the pulse voltage. Therefore, since the rising time of the voltage output to the output terminal OUT varies depending on whether the external circuit is normally connected to the output terminal OUT, there is a difference in the rising time of the detection signal output based on the result of comparing reference voltage VREF with the output voltage. It is therefore possible to output the determination signal indicating whether the external circuit is normally connected by the difference of the detection signal level in the determination time th.

Second Embodiment

Figure 5:
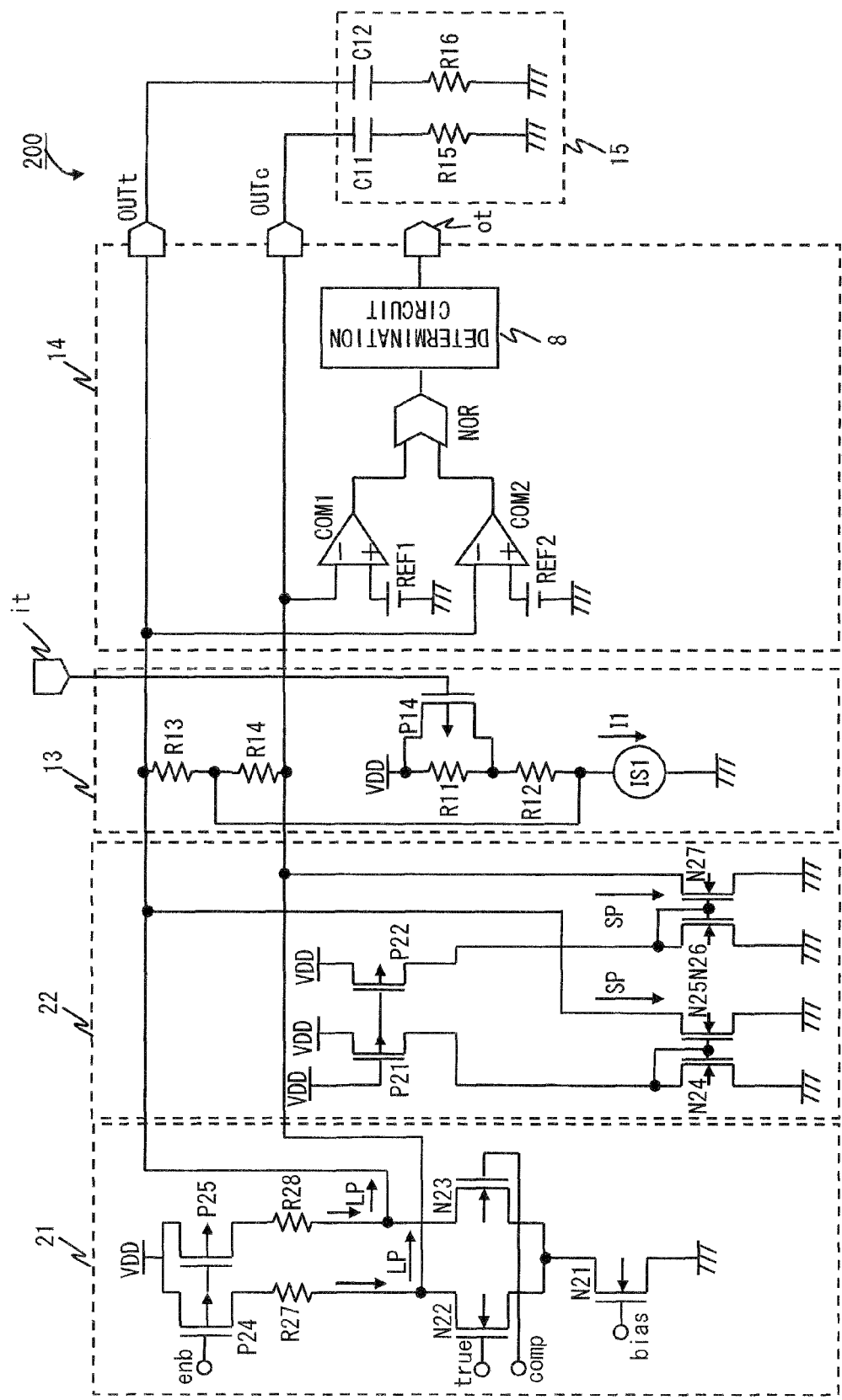
FIG. 5 is a diagram showing a connection detecting circuit 200 according to a second embodiment.

FIG. 5 is a diagram showing a connection detecting circuit 200 of the second embodiment. The configurations in FIGS. 5, and 6 to 10 described below that are the same as the configurations in FIG. 2 are denoted by the same reference symbols and detailed description thereof will be omitted. In the connection detecting circuit 200, the internal configurations of the output buffer 21 and the current compensation circuit 22 are different from those of the connection detecting circuit 100 in the first embodiment.

The output buffer 21 includes NMOS transistors N21 to N23, PMOS transistors P24 and P25, resistors R27 and R28, a positive signal input terminal true, a comparing signal input terminal comp, a bias terminal bias, and an enable terminal enb. The PMOS transistors P24 and P25 form the current mirror circuit Each source of the PMOS transistors P24 and P25 is connected to each power supply voltage VDD and gates thereof are connected to the enable terminal enb. Further, a drain of the PMOS transistor P24 is connected to a drain of the NMOS transistor N22 through the resistor R27 and a drain of the PMOS transistor P25 is connected to a drain of the NMOS transistor N23 through the resistor R28. Further, a gate of the NMOS transistor N22 is connected to the positive signal input terminal true and a gate of the NMOS transistor N23 is connected to the comparing signal input terminal comp. Further, sources of the NMOS transistors N22 and N23 are connected to a drain of the NMOS transistor N21. A source of the NMOS transistor N21 is connected to ground potential and a gate of the NMOS transistor N21 is connected to the bias terminal bias. Further, a node between the resistor R28 and the NMOS transistor N23 is connected to the output terminal OUTt, and a node between the resistor R27 and the NMOS transistor N22 is connected to the output terminal OUTc.

The current compensation circuit 22 includes PMOS transistors P21 and P22 corresponding to the second simulation current source and NMOS transistors N24 to N27 corresponding to the second current mirror circuit. The PMOS transistors P21 and P22 form the current mirror circuit. Sources and gates of the PMOS transistors P21 and P22 are connected to power supply voltage VDD. The NMOS transistors N24 and N25 form the current mirror circuit. Gates of the NMOS transistors N24 and N25 are connected in common and each source thereof is connected to each ground potential. Further, a drain of the NMOS transistor N24 is connected to a drain of the PMOS transistor P21, and a drain of the NMOS transistor N25 is connected to a node between the output buffer 21 and the output terminal OUTt. The NMOS transistors N26 and N27 form the current mirror circuit. Gates of the NMOS transistors N26 and N27 are connected in common and each source thereof is connected to each ground potential. A drain of the NMOS transistor N26 is connected to a drain of the PMOS transistor P22 and a drain of the NMOS transistor N27 is connected to a node between the output buffer 21 and the output terminal OUTc.

Now, an operation of the connection detecting circuit 200 of the present embodiment will be described with reference to FIG. 5. In the first embodiment, the simulation current is generated in order to compensate the leak current input to the output buffer 21 and the generated simulation current is input to the output buffer 21. On the other hand, in the present embodiment, the simulation current which is substantially the same as the leak current output from the output buffer 21 is generated and the generated simulation current is drawn from the output buffer 21. The operation of the connection detecting circuit 200 in the present embodiment is the same as the operation of the connection detecting circuit 100 in the first embodiment except for the operations of the output buffer 21 and the current compensation circuit 22. Therefore, only the operations of the output buffer and the current compensation circuit will hereinafter be described.

In connection detection operation, the output buffer 21 is in high impedance state. In this case, the PMOS transistors P24 and P25 are in off state based on the "H" level signal input to the enable terminal enb. At this time, the leak current LP flows in the PMOS transistors P24 and P25. The leak current LP is output to the external part of the output buffer 21.

The current compensation circuit 22 generates the second simulation current (hereinafter referred to as simulation current SP) where the second leak current (hereinafter referred to as leak current LP) output from the output buffer 21 is reproduced in the simulatory manner. Since the gate electrode and the source electrode of the PMOS transistors P21 and P22 which are the second simulation current sources are connected to power supply potential, the PMOS transistors P21 and P22 are in off state. The PMOS transistors P21 and P22 reproduce the PMOS transistors P24 and P25 forming the load circuit in the output buffer 21 in the simulatory manner. Therefore, the simulation current SP flows in the PMOS transistors P21 and P22. This simulation current SP flows in the NMOS transistors N24 and N26 connected to the PMOS transistors P21 and P22. Since the NMOS transistors N24 and N26 form the current mirror circuit, the simulation current SP flows in the NMOS transistors N25 and N27. Therefore, the current compensation circuit 22 generates the simulation current SP compensating voltage of the output terminal OUT increased by the leak current LP output from the output buffer 21 and draws the simulation current SP from the output buffer.

As stated above, in the present invention, there is provided a current compensation circuit 22 generating the simulation current compensating voltage increase of the output terminal OUT due to the leak current output from the output buffer 21. It is possible to generate the simulation current SP which is substantially the same current as the leak current LP output from the output buffer to draw the generated simulation current SP from the output buffer by employing the current compensation circuit. Therefore, it is possible to compensate the voltage increase of the output terminal OUT due to the leak current. Hence, the connection status can normally be determined.

Further, in the present embodiment, the second simulation current is generated by the PMOS transistors P21 and P22. The second simulation current is obtained by reproducing the PMOS transistors P24 and P25 forming the load circuit in the output buffer 21 in the simulatory manner. Therefore, the second simulation current source may be formed by one PMOS transistor. When the second simulation current source is formed by one PMOS transistor, the second current mirror circuit may be formed by three NMOS transistors.

Third Embodiment

Figure 6:
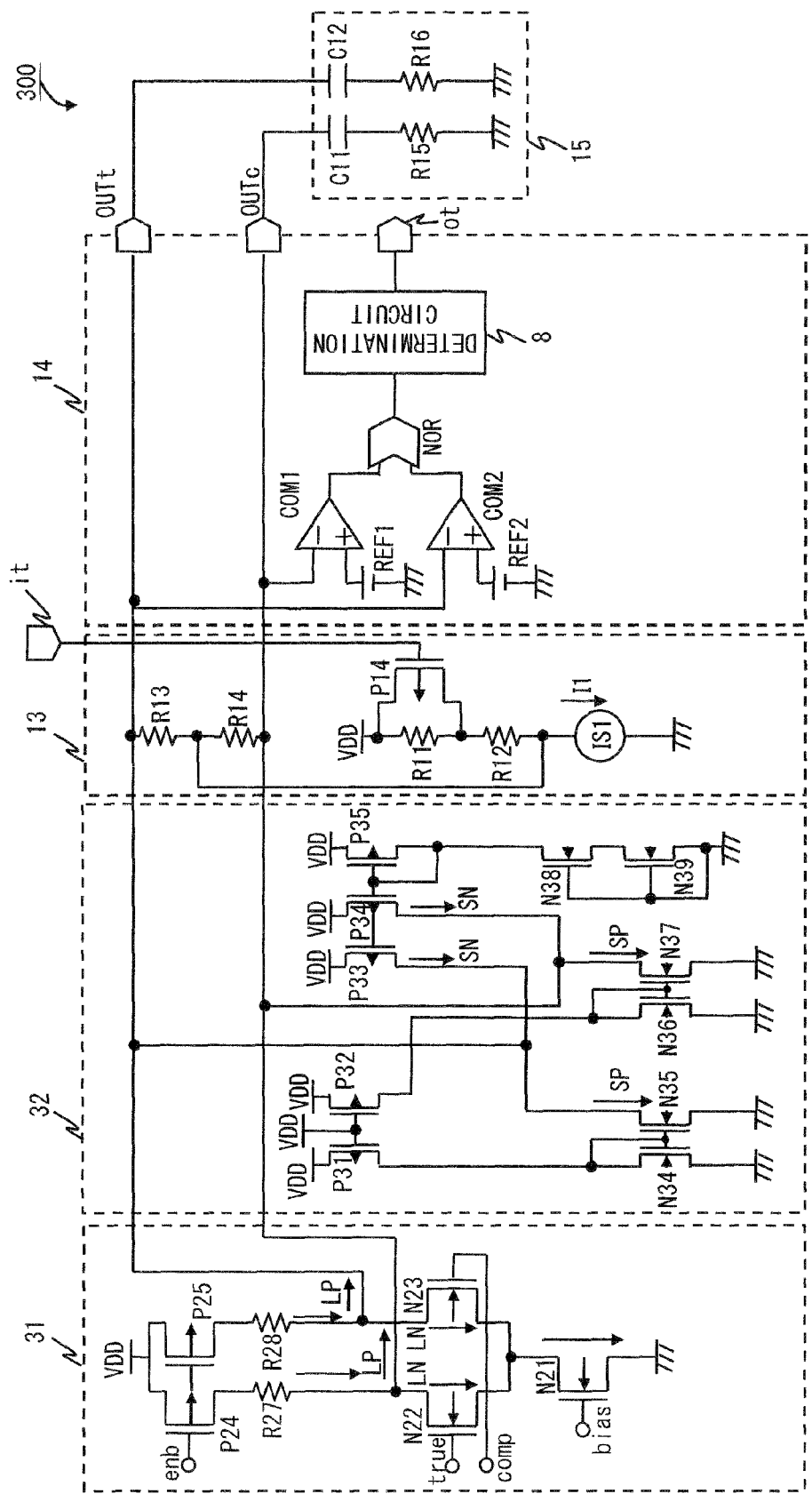
FIG. 6 is a diagram showing a connection detecting circuit 300 according to a third embodiment.

FIG. 6 shows a connection detecting circuit 300 of the third embodiment. In the connection detecting circuit 300, the internal configuration of the current compensation circuit is different from the internal configuration of the connection detecting circuit 200 of the second embodiment.

A current compensation circuit 32 includes NMOS transistors N38 and N39 corresponding to the first simulation current source, PMOS transistors P31 and P32 corresponding to the second simulation current source, PMOS transistors P33 to P35 corresponding to the first current mirror circuit, and NMOS transistors N34 to N37 corresponding to the second current mirror circuit. The PMOS transistors P31 and P32 form the current mirror circuit. Sources and gates of the PMOS transistors P31 and P32 are connected to power supply voltage VDD. The NMOS transistors N34 and N35 form the current mirror circuit. Gates of the NMOS transistors N34 and N35 are connected in common. A drain of the NMOS transistor N34 is connected to a drain of the PMOS transistor P31 and a source of the NMOS transistor N34 is connected to ground potential. Further, a drain of the NMOS transistor N35 is connected to a node between the output buffer 31 and the output terminal OUTt and a drain of the PMOS transistor P33, and a source of the NMOS transistor N35 is connected to ground potential.

The NMOS transistors N36 and N37 form the current mirror circuit. Gates of the NMOS transistors N36 and N37 are connected in common. A drain of the NMOS transistor N36 is connected to a drain of the PMOS transistor P32 and a source of the NMOS transistor N36 is connected to ground potential. A drain of the NMOS transistor N37 is connected to a node between the output buffer 31 and the output terminal OUTc and a drain of the PMOS transistor P34, and a source of the NMOS transistor N37 is connected to ground potential.

The PMOS transistors P33 to P35 form the current mirror circuit. Each source of the PMOS transistors P33 to P35 is connected to each power supply voltage VDD and gates thereof are connected in common. Further, a drain of the PMOS transistor P35 is connected to a drain of the NMOS transistor N38. A drain of the NMOS transistor N39 is connected to a source of the NMOS transistor N38 and a source of the NMOS transistor N39 is connected to ground potential. Gates of the NMOS transistors N38 and N39 are connected to ground potential.

An operation of the connection detecting circuit 300 of the present embodiment will be described hereinafter with reference to FIG. 6. In the first embodiment, there is generated a simulation current where the leak current input to the output buffer is reproduced in the simulatory manner and the generated simulation current is input to the output buffer. On the other hand, in the present embodiment, there is generated a differential simulation current which is substantially the same as a differential leak current between leak current output from the output buffer and leak current input to the output buffer. Note that the operation of the connection detecting circuit 300 in the present embodiment is the same as the operation of the connection detecting circuit in the first embodiment or the second embodiment except for the operation of the current compensation circuit 32. Therefore, only the operations of the output buffer and the current compensation circuit will be described.

In connection detection operation, the output buffer 31 is in high impedance state. In this case, each of the NMOS transistors N21 to N23 is in off state based on the "L" level signal input to the bias terminal bias, the positive signal input terminal true, and the comparing signal input terminal comp. The PMOS transistors P24 and P25 are in off state based on the "H" level signal input to the enable terminal enb. At this time, the leak current LP flows in the PMOS transistors P24 and P25 and the leak current LN flows in the NMOS transistors N21 to N23. Therefore, the differential leak current |LP−LN| flows in the output buffer 31.

The current compensation circuit 32 generates the differential simulation current |SP−SN| which is substantially the same current as the differential leak current |LP−LN| input to the output buffer 31. First, the first simulation current SN which is substantially the same current as the leak current LN input to the output buffer 32 is generated by the NMOS transistors N38 and N39. This first simulation current SN flows into the PMOS transistors P33 to P35. On the other hand, the second simulation current SP which is substantially the same current as the leak current LP output from the output buffer 31 is generated by the PMOS transistors P31 and P32. This second simulation current SP flows into the NMOS transistors N34 to N37. At this time, the differential current |SP−SN| between the second simulation current SP flowing in the NMOS transistor N35 and the first simulation current SN flowing in the PMOS transistor P33 or the differential current |SP−SN| between the second simulation current SP flowing in the NMOS transistor N37 and the first simulation current SN flowing in the PMOS transistor P34 is generated.

Therefore, when the leak current LP output from the PMOS transistors P24 and P25 is larger than the leak current LN flowing in the NMOS transistors N21 to N23 in the output buffer 31, current is drawn to ground potential by the simulation current (SP−SN) generated by the current compensation circuit 32. On the other hand, when the leak current LP output from the PMOS transistors P24 and P25 is smaller than the leak current LN flowing in the NMOS transistors N21 to N23 in the output buffer 31, then the simulation current (SN−SP) generated by the current compensation circuit 32 is input to the output buffer 31.

As stated above, in the present embodiment, there is provided a current compensation circuit 32 generating simulation current compensating voltage decrease or voltage increase of the output terminal OUT due to the differential leak current between the leak current output from the output buffer 31 and the leak current input to the output buffer 31. It is possible to generate the differential simulation current that is substantially the same as the differential leak current between the leak current output from the output buffer 31 and the leak current input to the output buffer 31 by employing the current compensation circuit. Therefore, it is possible to compensate voltage decrease or voltage increase of the output terminal OUT due to the leak current. Therefore, the connection status can normally be determined.

Fourth Embodiment

Figure 7:
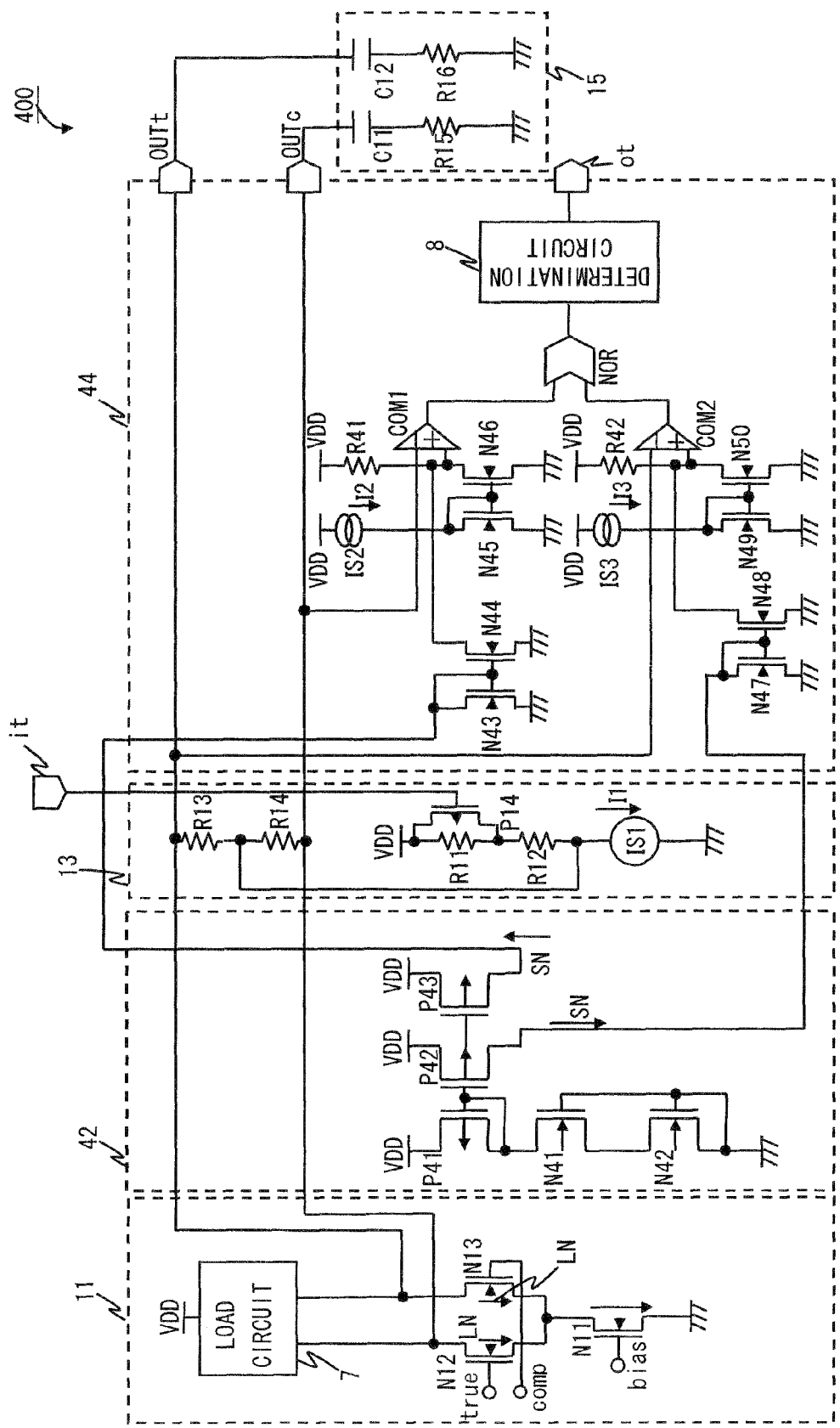
FIG. 7 is a diagram showing a connection detecting circuit 400 according to a fourth embodiment.

FIG. 7 shows a connection detecting circuit 400 of the fourth embodiment. The connection detecting circuit 400 includes an output buffer 11, a compensation circuit 42, a test voltage generating circuit (hereinafter referred to as pulse generating circuit) 13, and a connection detection determining circuit 44. In the connection detecting circuit 400 in the present embodiment, the internal configurations of the compensation circuit 42 and the connection detection determining circuit 44 are different from those of the connection detecting circuit 100 of the first embodiment. The compensation circuit 42 reproduces the leak current input to the output buffer 11 or output from the output buffer 11 in the simulatory manner and generates the simulation current for generating the reference voltage. The compensation circuit is called current compensation circuit in the following description. The connection detection determining circuit 44 generates reference voltage compensating voltage change of the output terminal OUT due to the leak current input to the output buffer 11 or output from the output buffer 11 and determines connection status of the external circuit based on the result of comparing reference voltage with voltage of the output terminal OUT.

In the first embodiment, a drain of the PMOS transistor P12 of the current compensation circuit 12 is connected to a node between the output buffer 11 and the output terminal OUTt, and a drain of the PMOS transistor P13 is connected to a node between the output buffer 11 and the output terminal OUTc. On the other hand, in the present embodiment, a drain of the PMOS transistor P42 of the current compensation circuit 42 is connected to a drain of the NMOS transistor N47 of the connection detection determining circuit 44, and a drain of a PMOS transistor P43 is connected to a drain of the NMOS transistor N43 of the connection detection determining circuit 44. The connection detection determining circuit 44 includes NMOS transistors N43 to N50, resistors R41 and R42, current sources IS2 and IS3, a first comparator COM1, a second comparator COM2, an NOR circuit NOR, and a determination circuit 8. The NMOS transistors N43 and N44 form the current mirror circuit. Gates of the NMOS transistors N43 and N44 are connected in common and each source thereof is connected to each ground potential. Further, a drain of the NMOS transistor N43 is connected to a drain of the PMOS transistor P43 of the current compensation circuit 42, and a drain of the NMOS transistor N44 is connected to a node between the NMOS transistor N46 and the resistor R41. The NMOS transistors N45 and N46 form the current mirror circuit. Gates of the NMOS transistors N45 and N46 are connected in common and each source thereof is connected to each ground potential. A drain of the NMOS transistor N45 is connected to power supply voltage VDD through the current source IS2. A drain of the NMOS transistor N46 is connected to power supply voltage VDD through the resistor R41.

The NMOS transistors N47 and N48 form the current mirror circuit. Gates of the NMOS transistors N47 and N48 are connected in common and each source thereof is connected to each ground potential. A drain of the NMOS transistor N47 is connected to a drain of the PMOS transistor P42 of the current compensation circuit 42, and a drain of the NMOS transistor N48 is connected to a node between the NMOS transistor N50 and the resistor R42. The NMOS transistor N49 and the NMOS transistor N50 form the current mirror circuit. Gates of the NMOS transistor N49 and the NMOS transistor N50 are connected in common and each source thereof is connected to each ground potential. A drain of the NMOS transistor N49 is connected to power supply voltage VDD through the current source IS3 and a drain of the NMOS transistor N50 is connected to power supply voltage VDD through the resistor R42.

The inverting input terminal of the first comparator COM1 is connected to a node between the output buffer 11 and the output terminal OUTc and the non-inverting input terminal is connected to a drain of the NMOS transistor N46. The inverting input terminal of the second comparator COM2 is connected to a node between the output buffer 11 and the output terminal OUTt and the non-inverting input terminal is connected to a drain of the NMOS transistor N50. Further, output parts of the first comparator COM1 and the second comparator COM2 are connected to the input part of the NOR circuit NOR. The output part of the NOR circuit NOR is connected to the determination circuit 8. The output part of the determination circuit 8 is connected to the determination signal output terminal ot.

An operation of the connection detecting circuit 400 of the present embodiment will be described with reference to FIG. 7. In the first embodiment, reference voltage VREF when the comparison is performed in the connection detection determining circuit 14 is set to the central value of the amplitude of the pulse voltage. On the other hand, in the present embodiment, reference voltage VREF is generated based on the simulation current SN output from the current compensation circuit 42. Note that the operation of the connection detecting circuit 400 of the present embodiment is the same as the operation of the connection detecting circuit 100 in the first embodiment except for the operations of the current compensation circuit 42 and the connection detection determining circuit 44. Therefore, only the operations of the current compensation circuit 42 and the connection detection determining circuit 44 will be described.

In connection detecting operation, the load circuit 7 of the output buffer 11 is in high impedance state and the NMOS transistors N11 to N13 are in off state. At this time, the leak current LN flows in the NMOS transistors N11 to N13. The current compensation circuit 42 generates the simulation current SN which is substantially the same current as the leak current LN by the NMOS transistors N41 and N42 corresponding to the first simulation current sources. The simulation current SN is output to the connection detection determining circuit 44 by the PMOS transistors P41 to P43 forming the first current mirror circuit. The simulation current SN input to the NMOS transistor N43 of the connection detection determining circuit 44 flows into the NMOS transistor N44 forming the current mirror circuit. Therefore, if the current I2 flows in the current source IS2, then reference voltage VREF input to the non-inverting input terminal of the first comparator COM1 can be expressed by VDD−(I2+simulation current SN)*R41. On the other hand, if the current I3 flows in the current source IS3, then reference voltage VREF input to the non-inverting input terminal of the second comparator COM2 can be expressed by VDD−(I3+simulation current SN)*R42. As stated, each reference voltage input to the first comparator COM1 or the second comparator COM2 is reduced by simulation current SN*R41 and simulation current SN*R42, respectively.

As stated above, in the present embodiment, reference voltage VREF is decreased by an equal amount as the voltage of the output terminal OUT is decreased by the leak current input to the output buffer 11. Accordingly, the connection status can normally be determined. Further, in the present embodiment, the reference voltage is generated by the simulation current where the leak current input to the output buffer 11 or output from the output buffer 11 is reproduced in the simulatory manner. However, this reference voltage can be generated so as to compensate voltage change of the output terminal in accordance with the leak current input to the output buffer 11 or output from the output buffer 11. Even in this case, the connection status can normally be determined.

Fifth Embodiment

Figure 8:
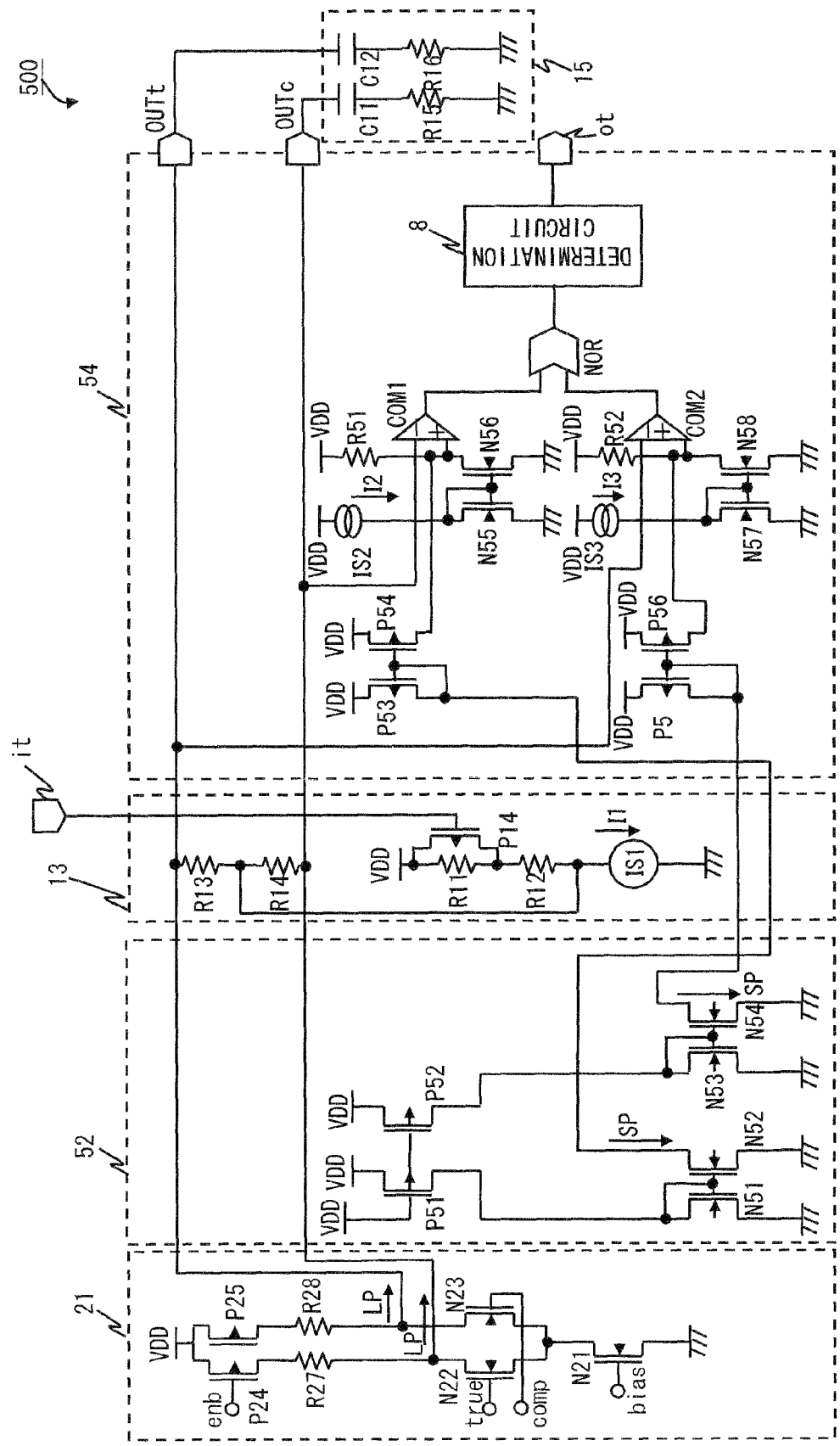
FIG. 8 is a diagram showing a connection detecting circuit 500 according to a fifth embodiment.

FIG. 8 shows a connection detecting circuit 500 of the fifth embodiment. In the connection detecting circuit 500, the internal configurations of the current compensation circuit 52 and the connection detection determining circuit 54 are different from those of the connection detecting circuit 200 in the second embodiment.

In the second embodiment, a drain of the NMOS transistor N25 of the current compensation circuit 22 is connected to a node between the output buffer 21 and the output terminal OUTt and a drain of the NMOS transistor N27 is connected to a node between the output buffer 21 and the output terminal OUTc. On the other hand, in the present embodiment, a drain of an NMOS transistor N52 of the current compensation circuit 52 is connected to a drain of the PMOS transistor P53 of the connection detection determining circuit 54, and a drain of the NMOS transistor N54 is connected to a drain of the PMOS transistor P55 of the connection detection determining circuit 54.

The connection detection determining circuit 54 includes PMOS transistors P53 to P56, NMOS transistors N55 to N58, a resistor R51, a resistor R52, current sources IS2 and IS3, a first comparator COM1, a second comparator COM2, an NOR circuit NOR, and a determination circuit 8. The PMOS transistors P53 and P54 form the current mirror circuit. Gates of the PMOS transistors P53 and P54 are connected in common and each source of the PMOS transistors P53 and P54 is connected to each power supply voltage VDD. A drain of the PMOS transistor P53 is connected to a drain of the NMOS transistor N52 of the current compensation circuit 52, and a drain of the PMOS transistor P54 is connected to a node between the NMOS transistor N56 and the resistor R51.

The NMOS transistors N55 and N56 form the current mirror circuit. Gates of the NMOS transistors N55 and N56 are connected in common and each source of the NMOS transistors N55 and N56 is connected to ground potential. A drain of the NMOS transistor N55 is connected to power supply voltage VDD through the current source IS2 and a drain of the NMOS transistor N56 is connected to power supply voltage VDD through the resistor R51.

The PMOS transistors P55 and P56 form the current mirror circuit. Gates of the PMOS transistors P55 and P56 are connected in common and each source of the PMOS transistors P55 and P56 is connected to each power supply voltage VDD. A drain of the PMOS transistor P55 is connected to a drain of the NMOS transistor N54 of the current compensation circuit 52, and a drain of the PMOS transistor P56 is connected to a node between the NMOS transistor N58 and the resistor R52. The NMOS transistors N57 and N58 form the current mirror circuit. Gates of the NMOS transistors N57 and N58 are connected in common and each source of the NMOS transistors N57 and N58 is connected to ground potential. A drain of the NMOS transistor N57 is connected to power supply voltage VDD through the current source IS3 and a drain of the NMOS transistor N58 is connected to power supply voltage VDD through the resistor R52.

The inverting input terminal of the first comparator COM1 is connected to a node between the output buffer 21 and the output terminal OUTc and the non-inverting input terminal is connected to a drain of the NMOS transistor N56. The inverting input terminal of the second comparator COM2 is connected to a node between the output buffer 21 and the output terminal OUTt and the non-inverting input terminal is connected to a drain of the NMOS transistor N58. The output parts of the first comparator COM1 and the second comparator COM2 are connected to the input part of the NOR circuit NOR. The output part of the NOR circuit NOR is connected to the determination circuit 8.

Now, an operation of the connection detecting circuit 500 of the present embodiment will be described with reference to FIG. 8. In the second embodiment, reference voltage VREF when the comparison is performed by the connection detection determining circuit 14 is set to the central value of the amplitude of the pulse voltage. On the other hand, in the present embodiment, reference voltage VREF is generated based on the simulation current output from the current compensation circuit 52. Note that the operation of the connection detecting circuit 500 in the present embodiment is the same as the operation of the connection detecting circuit 200 in the second embodiment except for the operations of the current compensation circuit 52 and the connection detection determining circuit 54. Therefore, only the operations of the current compensation circuit 52 and the connection detection determining circuit 54 will be described.

As shown in the second embodiment, the current compensation circuit 52 generates the simulation current SP where the leak current LP output from the output buffer is reproduced in the simulatory manner. This simulation current SP is output to the connection detection determining circuit 54 by the NMOS transistors N52 and N54 forming the current mirror. The simulation current SP input to the PMOS transistor P53 of the connection detection determining circuit 54 flows into the NMOS transistor N54 forming the current mirror circuit. Therefore, reference voltage VREF input to the non-inverting input terminal of the first comparator COM1 can be expressed by VDD−(I2−simulation current SP)*R51. On the other hand, reference voltage VREF input to the non-inverting input terminal of the second comparator COM2 can be expressed by VDD−(I3−simulation current SP)*R52. As stated, each reference voltage input to the first comparator COM1 or the second comparator COM2 is increased by simulation current SN*R51 and simulation current SN*R52, respectively.

As stated above, in the present embodiment, reference voltage VREF is increased by an equal amount as the voltage of the output terminal OUT is increased by the leak current output from the output buffer 21. Therefore, the connection status can normally be determined.

Sixth Embodiment

Figure 9:
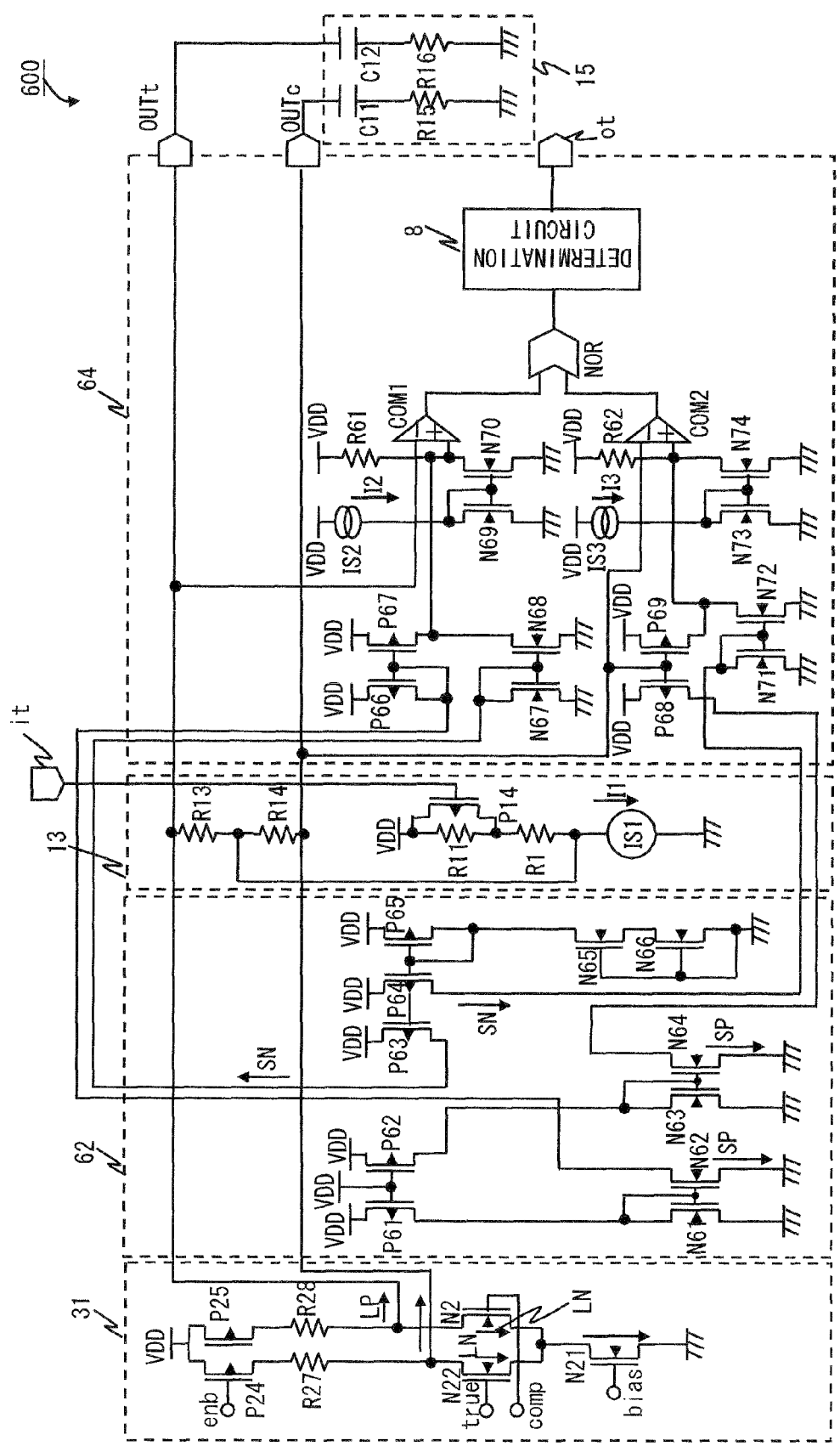
FIG. 9 is a diagram showing a connection detecting circuit 600 according to a sixth embodiment.

FIG. 9 shows a connection detecting circuit 600 of the sixth embodiment. In the connection detecting circuit 600, the internal configurations of the current compensation circuit 62 and the connection detection determining circuit 64 are different from those of the connection detecting circuit 300 in the third embodiment.

The current compensation circuit 62 includes PMOS transistors P61 to P65 and NMOS transistors N61 to N66. The PMOS transistors P61 and P62 form the current mirror circuit. Gates of the PMOS transistors P61 and P62 are connected in common and each source thereof is connected to each power supply voltage. The NMOS transistors N61 and N62 form the current mirror circuit. Gates of the NMOS transistors N61 and N62 are connected in common and each source thereof is connected to ground potential. Further, a drain of the NMOS transistor N61 is connected to a drain of the PMOS transistor P61. The NMOS transistors N63 and N64 form the current mirror circuit. Gates of the NMOS transistors N63 and N64 are connected in common and each source thereof are connected to ground potential. A drain of the NMOS transistor N63 is connected to a drain of the PMOS transistor P62.

The PMOS transistors P63 to P65 form the current mirror circuit. Gates of the PMOS transistors P63, P64, and P65 are connected in common and each source thereof is connected to each power supply voltage. Further, a drain of the PMOS transistor P65 is connected to a drain of the NMOS transistor N65. A drain of the NMOS transistor N66 is connected to a source of the NMOS transistor N65 and a source thereof is connected to ground potential. Gates of the NMOS transistors N65 and N66 are connected to ground potential.

The connection detection determining circuit 64 includes PMOS transistors P66 to P69, NMOS transistors N67 to N74, resistors R61 and R62, current sources IS2 and IS3, a first comparator COM1, a second comparator COM2, an NOR circuit NOR, and a determination circuit 8. The PMOS transistors P66 and P67 form the current mirror circuit. Gates of the PMOS transistors P66 and P67 are connected in common and each source thereof is connected to each power supply voltage. Further, a drain of the PMOS transistor P66 is connected to a drain of the NMOS transistor N62 of the current compensation circuit 62, and a drain of the PMOS transistor P67 is connected to a node between the NMOS transistor N70 and the resistor R61. The NMOS transistors N67 and N68 form the current mirror circuit. Gates of the NMOS transistors N67 and N68 are connected in common and each source thereof is connected to ground potential. A drain of the NMOS transistor N67 is connected to a drain of the PMOS transistor P63 of the current compensation circuit 62 and a drain of the NMOS transistor N68 is connected to a drain of the PMOS transistor P67. The NMOS transistors N69 and N70 form the current mirror circuit. Gates of the NMOS transistors N69 and N70 are connected in common and each source thereof is connected to ground potential. A drain of the NMOS transistor N69 is connected to power supply voltage VDD through the current source IS2, and a drain of the NMOS transistor N70 is connected to power supply voltage VDD through the resistor R61.

The PMOS transistors P68 and P69 form the current mirror circuit. Gates of the PMOS transistors P68 and P69 are connected in common and each source of the PMOS transistors P68 and P69 is connected to each power supply voltage VDD. A drain of the PMOS transistor P68 is connected to a drain of the NMOS transistor N64 of the current compensation circuit 62, and a drain of the PMOS transistor P69 is connected to a node between the NMOS transistor N74 and the resistor R62. The NMOS transistors N71 and N72 form the current mirror circuit. Gates of the NMOS transistors N71 and N72 are connected in common and each source of the NMOS transistors N71 an N72 is connected to ground potential. A drain of the NMOS transistor N71 is connected to a drain of the PMOS transistor P64 of the current compensation circuit 62 and a drain of the NMOS transistor N72 is connected to a drain of the PMOS transistor P69. The NMOS transistors N73 and N74 form the current mirror circuit. Gates of the NMOS transistors N73 and N74 are connected in common and each source thereof is connected to ground potential. A drain of the NMOS transistor N73 is connected to power supply voltage VDD through the current source IS3, and a drain of the NMOS transistor N74 is connected to power supply voltage VDD through the resistor R62.

The inverting input terminal of the first comparator COM1 is connected to a node between the output buffer 31 and the output terminal OUTt and the non-inverting input terminal is connected to a drain of the NMOS transistor N70. The inverting input terminal of the second comparator COM2 is connected to a node between the output buffer 31 and the output terminal OUTc and the non-inverting input terminal is connected to a drain of the NMOS transistor N74. The output parts of the first comparator COM1 and the second comparator COM2 are connected to the input part of the NOR circuit NOR. The output part of the NOR circuit NOR is connected to the determination circuit 8.

Now, an operation of the connection detecting circuit 600 of the present embodiment will be described with reference to FIG. 9. In the third embodiment, reference voltage VREF when the comparison is performed in the connection detection determining circuit 14 is set to the central value of the amplitude of the pulse voltage. On the other hand, in the present embodiment, reference voltage VREF is generated based on the simulation current output from the current compensation circuit 62. Note that the operation of the connection detecting circuit 600 in the present embodiment is the same as the operation of the connection detecting circuit 300 in the third embodiment except for the operations of the current compensation circuit 62 and the connection detection determining circuit 64. Therefore, only the operations of the current compensation circuit 62 and the connection detection determining circuit 64 will be described.

The differential current |SP−SN| generated by the current compensation circuit 32 shown in the third embodiment is input to the connection detection determining circuit 14. Therefore, reference voltage VREF input to the non-inverting input terminal of the first comparator COM1 can be expressed by VDD−(I2−differential current |SP−SN|)*R61 and reference voltage VREF input to the non-inverting input terminal of the second comparator COM2 can be expressed by VDD−(I3−differential current |SP−SN|)*R62.

As stated above, in the present embodiment, there is provided a current compensation circuit generating the differential simulation current compensating voltage decrease or voltage increase of the output terminal OUT due to the differential leak current between the leak current output from the output buffer 31 and the leak current input to the output buffer 31. Then reference voltage VREF is generated based on the differential simulation current. Therefore, it is possible to normally determine the connection status by decreasing or increasing reference voltage by an equal amount as the voltage of the output terminal OUT is decreased or increased by the differential leak current.

Seventh Embodiment

Figure 10:
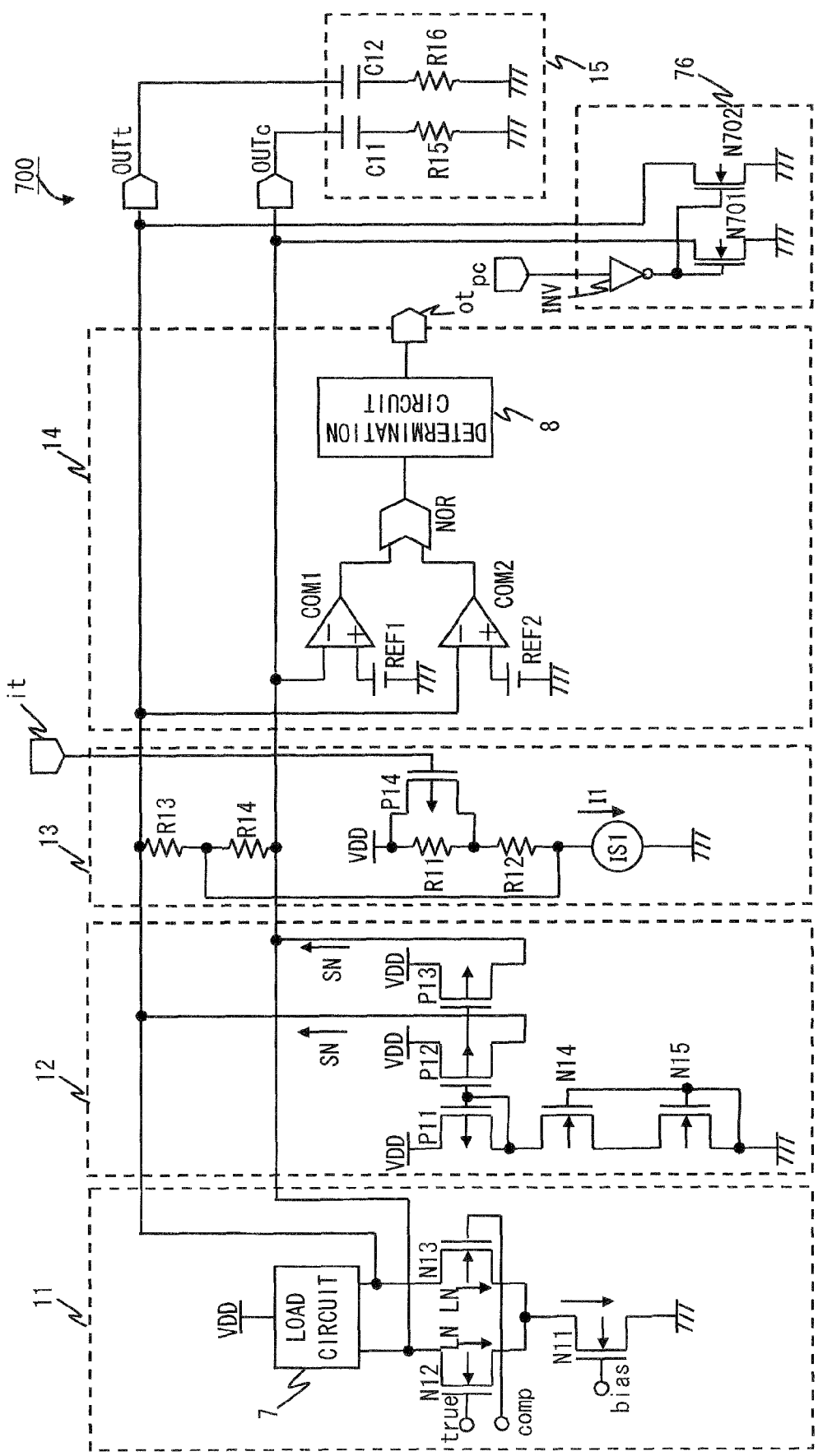
FIG. 10 is a diagram showing a connection detecting circuit 700 according to a seventh embodiment.

FIG. 10 shows a connection detecting circuit 700 of the seventh embodiment. In the connection detecting circuit 700, a charge removing circuit 76 is added to the connection detecting circuit 100 in the first embodiment.

The charge removing circuit 76 includes an inverter INV, and NMOS transistors N701 and N702 corresponding to the second switches. The NMOS transistors N701 and N702 form the current mirror circuit. Gates of the NMOS transistors N701 and N702 are connected in common and each source thereof is connected to each ground potential. A power clear terminal pc is connected to the gates of the NMOS transistors N701 and N702 through the inverter INV and drains of the NMOS transistors N701 and N702 are connected to the output terminal OUTt. A drain of the NMOS transistor N702 is connected to the output terminal OUTt.

Now, an operation of the connection detecting circuit 700 of the present embodiment will be described with reference to FIG. 10. Note that the operation of the connection detecting circuit 700 in the present embodiment is the same as the operation of the connection detecting circuit 100 in the first embodiment except for the operation of the charge removing circuit 76. Therefore, only the operation of the charge removing circuit 76 will be described.

The charge removing circuit 76 draws out charges stored in the capacities C11 and C12 of the external circuit 15 when power supply is instantaneously cut off. More specifically, the charge removing circuit 76 inputs "L" level signal to the power clear terminal pc. In this case, "H" level signal is input to the gates of the NMOS transistors N701 and N702 through the inverter INV and therefore the NMOS transistors N701 and N702 are in on state. At this time, the charges stored in the capacitors C11 and C12 flow in ground potential through the NMOS transistors N701 and N702. Therefore, after the power failure is over and the detection operation is restarted, the charges in the load capacities C1 and C2 are in zero state.

Figure 15:
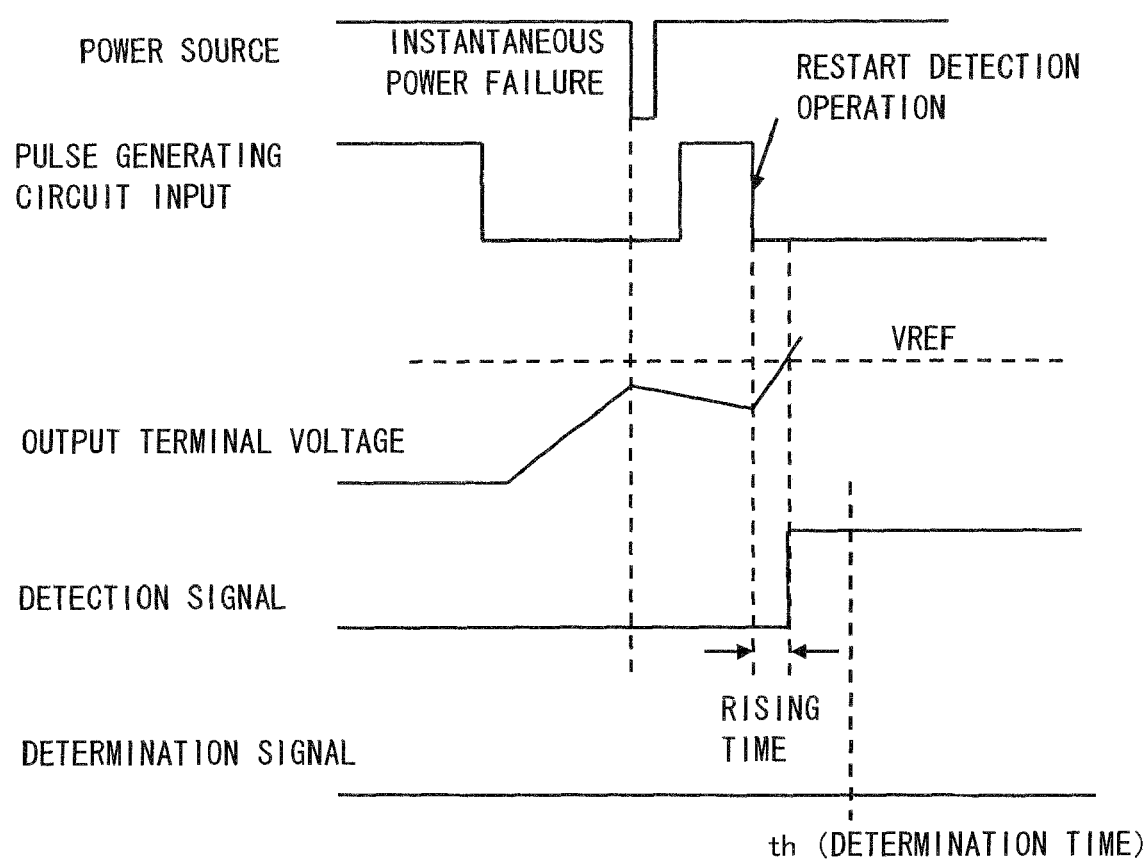
FIG. 15 is a timing chart when there is no charge removing circuit provided in the related connection detecting circuit.

FIG. 15 shows a timing chart in normal connection when there is no charge removing circuit provided. If instantaneous power failure is occurred when there is no charge removing circuit, the charges stored in the load capacities C11 and C12 are drawn out by the leak current LN. In this case, the time T needed to completely draw out the charges can be expressed by C1*V/I. Therefore, since voltage of the output terminal OUT is not completely decreased when the detection operation is restarted, the detection time is reduced (see rising time in FIG. 15). Therefore, since the detection signal is in "H" level indicating non-connecting status in the determination time th, there is a possibility that the connection status may be detected as non-connecting state, which is the false detection.

Figure 11:
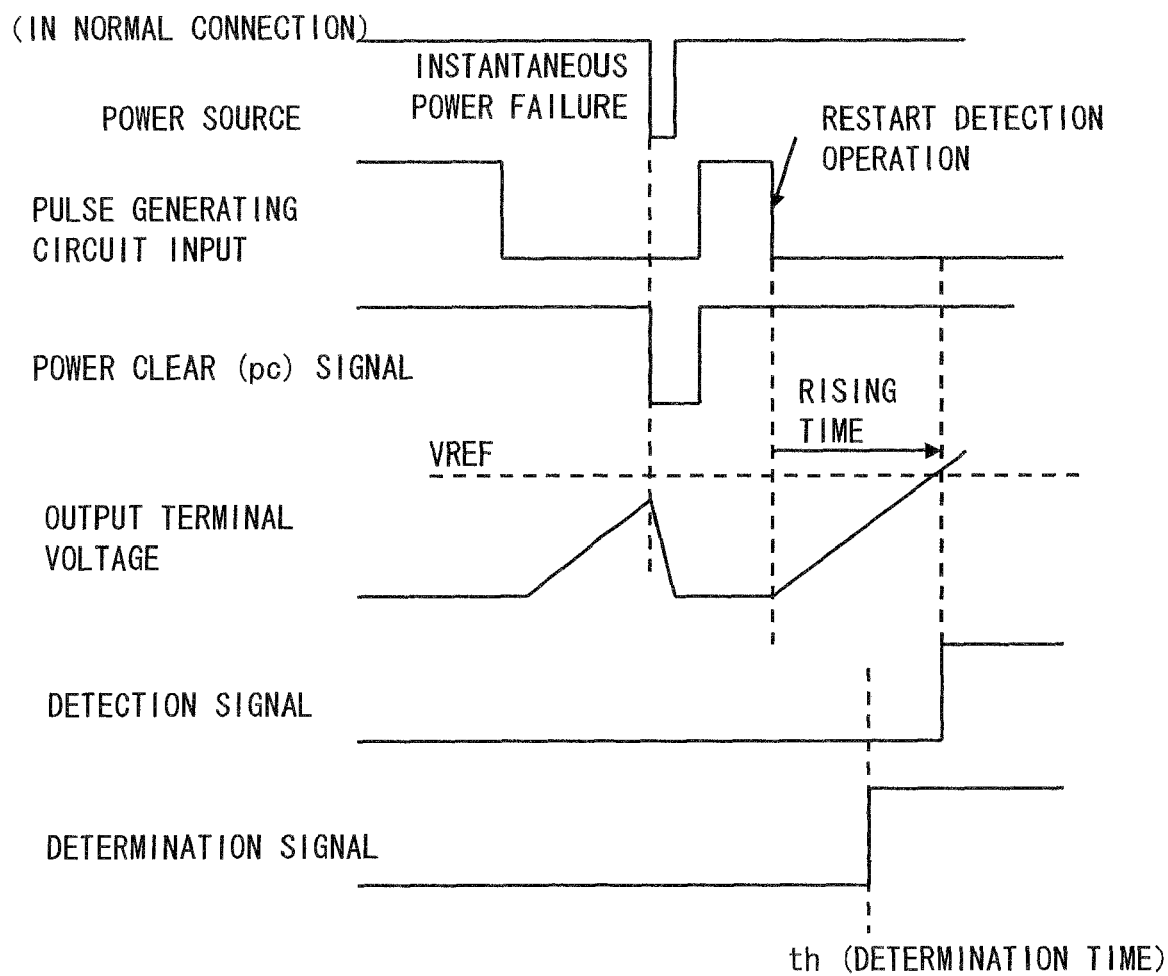
FIG. 11 is a timing chart when a charge removing circuit is added to the connection detecting circuit according to the seventh embodiment.
Figure 12:
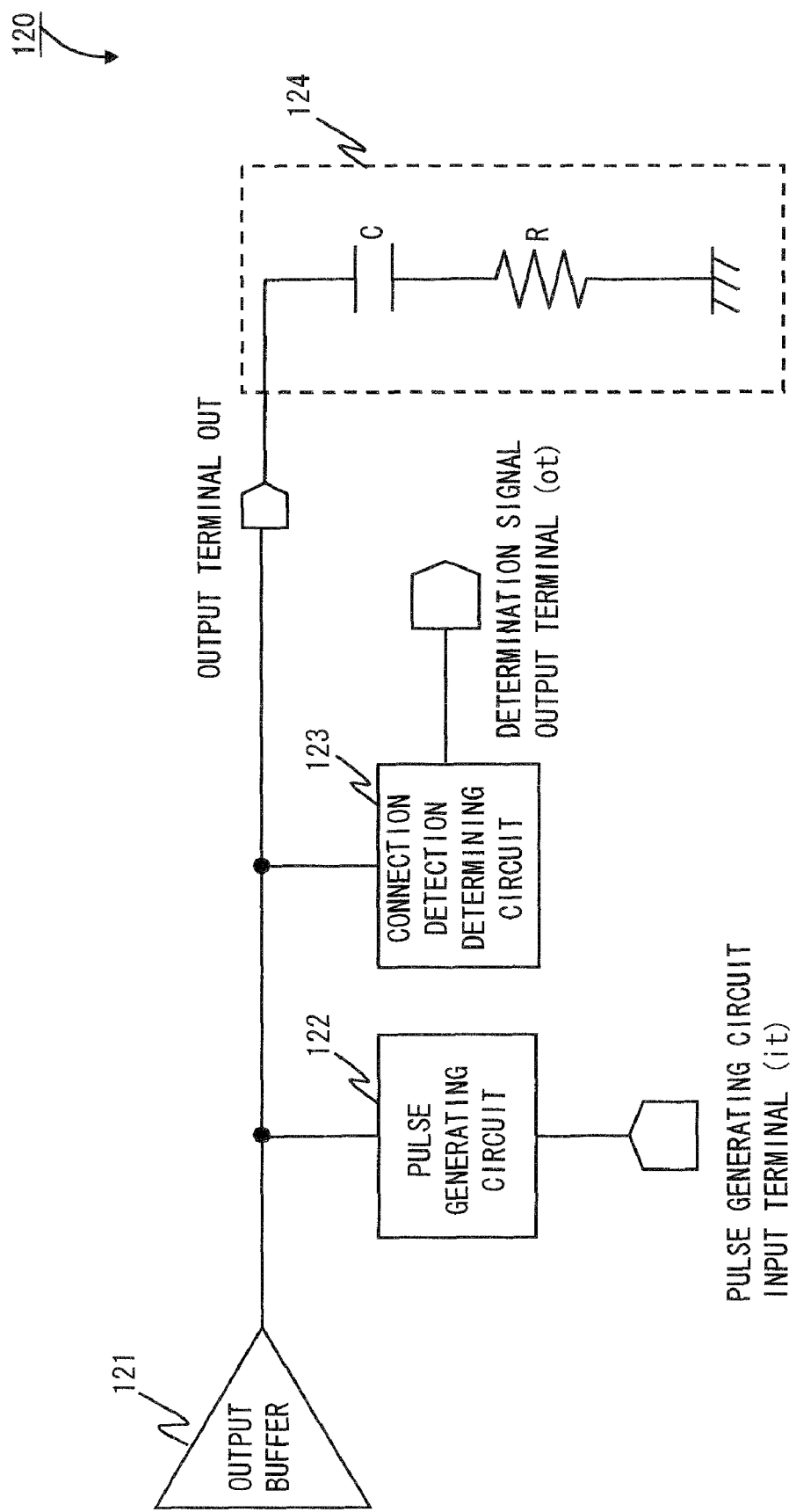
FIG. 12 is a diagram showing a related connection detecting circuit.

On the other hand, in the present embodiment, the charge removing circuit is added to the connection detecting circuit. FIG. 11 shows a timing chart when the charge removing circuit 76 is added to the connection detecting circuit 700. In the charge removing circuit 76, the charges stored in the capacities C11 and C12 of the external circuit 15 is drawn out in the instantaneous power failure. Accordingly, it is possible to prevent false detection since the charges of the load capacities C11 and C12 are in zero state when the detection operation is restarted.

Although the charge removing circuit 76 is added to the connection detecting circuit 100 of the first embodiment in the present embodiment, the charge removing circuit 76 may be connected to one of the connection detecting circuits 200 to 600 of the second to sixth embodiments. Even in this case, since the charge removing circuit 76 draws out charges stored in the capacity of the external circuit 15 in the instantaneous power failure, the false detection can be prevented.

As stated above, in the present invention, the current compensation circuit is provided in the connection detecting circuit. In the current compensation circuit, there is provided a simulation current where the leak current input to the output buffer or output from the output buffer is reproduced in the simulatory manner. Therefore, it is possible to compensate voltage decrease or voltage increase of the output terminal due to the leak current. Accordingly, the connection status can normally be determined.

The charge removing circuit is added to the connection detecting circuit. The charge removing circuit draws out the charges stored in the capacity of the external circuit in the instantaneous power failure. Therefore, it is possible to make the charges of the load capacity in zero state. Accordingly, the false detection can be prevented.

It is apparent that the present invention is not limited to the above embodiments, but may be modified and changed without departing from the scope and spirit of the invention. For example, although the current compensation circuit and internal part of the output buffer are formed by MOS transistors in this invention, bipolar transistors may be used in place of the MOS transistors.

What is claimed is:

1. A semiconductor device for determining connection status between an output terminal connected to an output buffer and an external device, the semiconductor device comprising:
   a test voltage generating circuit to generate test voltage for changing voltage of the output terminal;
   a connection detection determining circuit to compare voltage of the output terminal with reference voltage and to determine connection status of the external device based on the comparing result; and
   a compensation circuit to generate simulation current where leak current generated at the output buffer is reproduced in a simulatory manner and to compensate voltage change of the output terminal by the simulation current.

2. The semiconductor device according to claim 1, wherein the compensation circuit comprises:
   a first simulation current source connected to ground potential and to generate a first simulation current where a first leak current input to the output buffer is reproduced in the simulatory manner; and
   a first current mirror circuit connected between the simulation current source and power supply potential and to output the first simulation current to the output buffer.

3. The semiconductor device according to claim 2, wherein the first simulation current source has a gate electrode and a source electrode connected to the ground potential and is formed by a transistor which is substantially the same as a transistor connected between the output terminal and ground potential in the output buffer.

4. The semiconductor device according to claim 1, wherein the compensation circuit comprises:
   a second simulation current source connected to power supply potential and to generate a second simulation current where a second leak current output from the output buffer is reproduced in the simulatory manner; and
   a second current mirror circuit connected between the second simulation current source and ground potential.

5. The semiconductor device according to claim 4, wherein the second simulation current source has a gate electrode and a source electrode connected to the power supply potential and is formed by a transistor which is substantially the same as a transistor forming a load circuit in the output buffer.

6. The semiconductor device according to claim 1, wherein the compensation circuit comprises:
   a first simulation current source connected to ground potential and to generate a first simulation current where a first leak current input to the output buffer is reproduced in the simulatory manner;
   a first current mirror circuit connected between the simulation current source and power supply potential and to output the first simulation current to the output terminal;
   a second simulation current source connected to power supply potential and to generate a second simulation current where a second leak current output from the output buffer is reproduced in the simulatory manner; and
   a second current mirror circuit connected between the second simulation current source and ground potential, wherein
   a differential current between the first simulation current and the second simulation current is substantially the same current as a differential current between the first leak current and the second leak current.

7. The semiconductor device according to claim 2, wherein the compensation circuit comprises:
   a first simulation current source connected to ground potential and to generate a first simulation current where a first leak current input to the output buffer is reproduced in the simulatory manner;
   a first current mirror circuit connected between the simulation current source and power supply potential and to output the first simulation current to the output terminal;
   a second simulation current source connected to power supply potential and to generate a second simulation current where a second leak current output from the output buffer is reproduced in the simulatory manner; and
   a second current mirror circuit connected between the second simulation current source and ground potential, wherein
   a differential current between the first simulation current and the second simulation current is substantially the same current as a differential current between the first leak current and the second leak current.

8. The semiconductor device according to claim 3, wherein the compensation circuit comprises:
   a first simulation current source connected to ground potential and to generate a first simulation current where a first leak current input to the output buffer is reproduced in the simulatory manner;
   a first current mirror circuit connected between the simulation current source and power supply potential and to output the first simulation current to the output terminal;
   a second simulation current source connected to power supply potential and to generate a second simulation current where a second leak current output from the output buffer is reproduced in the simulatory manner; and
   a second current mirror circuit connected between the second simulation current source and ground potential, wherein
   a differential current between the first simulation current and the second simulation current is substantially the same current as a differential current between the first leak current and the second leak current.

9. The semiconductor device according to claim 1, further comprising a charge removing circuit to draw out charges stored in the external device.

10. The semiconductor device according to claim 7, wherein the semiconductor device further comprises a compensation circuit to reproduce leak current generated at the output buffer in the simulatory manner and generating simulation current generating the reference voltage.

11. The semiconductor device according to claim 8, wherein the compensation circuit comprises:
   a first simulation current source connected to ground potential and to generate a first simulation current where a first leak current input to the output buffer is reproduced in the simulatory manner; and
   a first current mirror circuit connected between the simulation current source and power supply potential and to output the first simulation current to the connection detection determining circuit.

12. The semiconductor device according to claim 10, wherein the compensation circuit comprises:
- a second simulation current source connected to power supply potential and to generate a second simulation current where a second leak current output from the output buffer is reproduced in the simulatory manner; and
- a second current mirror circuit connected between the second simulation current source and ground potential and to output the second simulation current to ground potential.

13. The semiconductor device according to claim 10, wherein the compensation circuit comprises:
- a first simulation current source connected to ground potential and to generate a first simulation current where a first leak current input to the output buffer is reproduced in the simulatory manner;
- a first current mirror circuit connected between the simulation current source and power supply potential and to output the first simulation current to the connection detection determining circuit;
- a second simulation current source connected to power supply potential and to generate a second simulation current where a second leak current output from the output buffer is reproduced in the simulatory manner; and
- a second current mirror circuit connected between the second simulation current source and ground potential and to output the second simulation current to ground potential, wherein
- the differential current between the first simulation current and the second simulation current is substantially the same current as the differential current between the first leak current and the second leak current.

14. The semiconductor device according to claim 1, wherein the test voltage generating circuit outputs a pulse formed by a first level voltage and a second level voltage larger than the first level voltage to the output terminal as the test voltage.

15. The semiconductor device according to claim 2, wherein the test voltage generating circuit outputs a pulse formed by a first level voltage and a second level voltage larger than the first level voltage to the output terminal as the test voltage.

16. The semiconductor device according to claim 1, wherein the test voltage generating circuit comprises:
- a first resistor and a second resistor connected to power supply potential in series;
- a current source connected between the second resistor and ground potential; and
- a first switch connected to the first resistor in parallel, wherein
- the test voltage is generated based on level signal input to the first switch and is output to the output terminal from a node between the second resistor and the current source.

17. The semiconductor device according to claim 2, wherein the test voltage generating circuit comprises:
- a first resistor and a second resistor connected to power supply potential in series;
- a current source connected between the second resistor and ground potential; and
- a first switch connected to the first resistor in parallel, wherein
- the test voltage is generated based on level signal input to the first switch and is output to the output terminal from a node between the second resistor and the current source.

18. The semiconductor device according to claim 3, wherein the test voltage generating circuit comprises:
- a first resistor and a second resistor connected to power supply potential in series;
- a current source connected between the second resistor and ground potential; and
- a first switch connected to the first resistor in parallel, wherein
- the test voltage is generated based on level signal input to the first switch and is output to the output terminal from a node between the second resistor and the current source.

19. The semiconductor device according to claim 9, wherein the charge removing circuit includes a second switch connected between the output terminal and ground potential and switched between on state and off state based on input of level signal, and
- the charge removing circuit outputs charges stored in the external device to ground potential through the second switch when the switch is in on state.

20. A semiconductor device for determining connection status between an output terminal connected to an output buffer and an external device, the semiconductor device comprising:
- a test voltage generating circuit to generate test voltage for changing voltage of the output terminal; and
- a connection detection determining circuit to generate reference voltage for compensating voltage change of the output terminal according to leak current generated at the output buffer and to determine connection status of the external device based on a result of comparing the reference voltage with voltage of the output terminal.

* * * * *